United States Patent [19]

Taguchi et al.

[11] Patent Number: 5,220,190
[45] Date of Patent: Jun. 15, 1993

[54] DEVICE HAVING A CHARGE TRANSFER DEVICE, MOSFETS, AND BIPOLAR TRANSISTORS—ALL FORMED IN A SINGLE SEMICONDUCTOR SUBSTRATE

[75] Inventors: Minoru Taguchi, Oomiya; Kazuo Kihara, Yokohama, both of Japan

[73] Assignee: Kabushiki Kaisha Toshiba, Kawasaki, Japan

[21] Appl. No.: 641,921

[22] Filed: Jan. 16, 1991

[30] Foreign Application Priority Data

Jan. 19, 1990 [JP] Japan .................................. 2-9577

[51] Int. Cl.⁵ ............................. H01L 27/02; H01L 29/78
[52] U.S. Cl. ............................. 257/499; 257/370; 257/215; 257/506; 257/544
[58] Field of Search .................. 357/47-49, 357/42, 43, 24, 23.14; 257/499, 370, 215, 506, 544, 546, 552

[56] References Cited

U.S. PATENT DOCUMENTS

| | | | |
|---|---|---|---|
| 4,253,168 | 2/1981 | Petrosky et al. | 367/123 |
| 4,314,857 | 2/1982 | Aitken | 357/24 |
| 4,646,124 | 2/1987 | Zunino | 357/43 |

FOREIGN PATENT DOCUMENTS

| | | |
|---|---|---|
| 0242748 | 10/1987 | European Pat. Off. |
| 0245515 | 11/1987 | European Pat. Off. |
| 0392536 | 10/1990 | European Pat. Off. |
| 63-107161 | 5/1988 | Japan |
| 63-199454 | 8/1988 | Japan |

OTHER PUBLICATIONS

Electronics, Oct. 28, 1976, pp. 8E and 10E, "One process adapts CCD devices to MOS, bipolar peripheral circuits".

Primary Examiner—Mark V. Prenty
Attorney, Agent, or Firm—Finnegan, Henderson, Farabow, Garrett & Dunner

[57] ABSTRACT

A semiconductor device according to the present invention has a semiconductor body of a first conductivity type, three islands of a second conductivity type, formed in the surface of the semiconductor body. Two wells of the first conductivity are formed in the first and second islands. The device further has a charge transfer device which back gate is formed of the first well, an insulated-gate FET of the first conductivity type which back gate is formed of the second island, an insulated-gate FET of the second conductivity type which back gate is formed of the second well, and a bipolar transistor which collector is formed of the third island. The first island surrounds the first well which serves as back gate of the charge transfer device, and blocks the noise generated in the first well. Hence, the other islands are free from the influence of the noise.

24 Claims, 19 Drawing Sheets

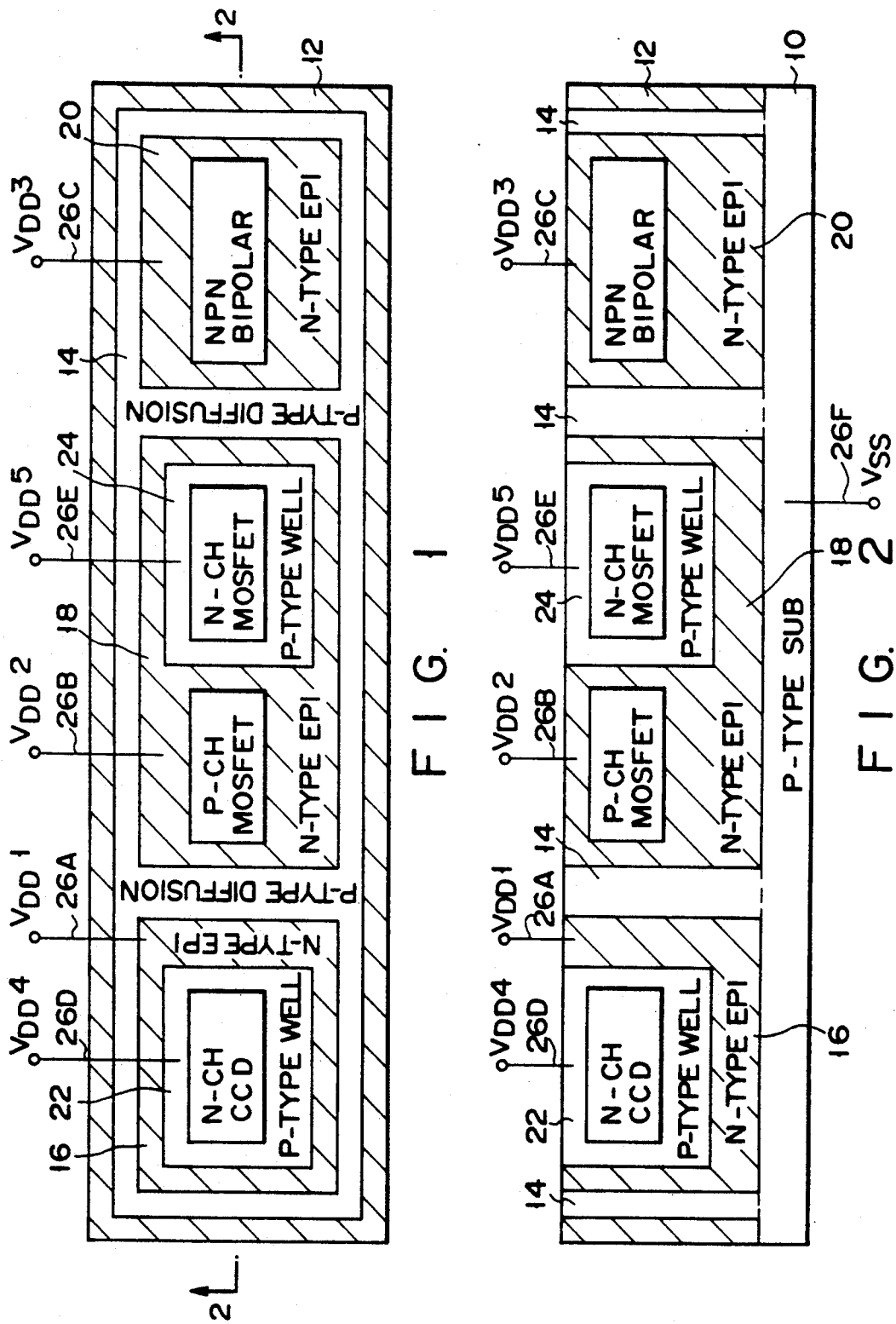

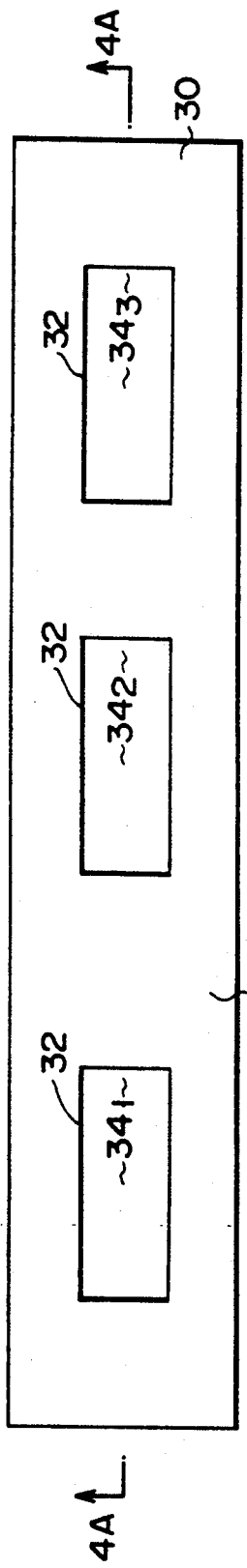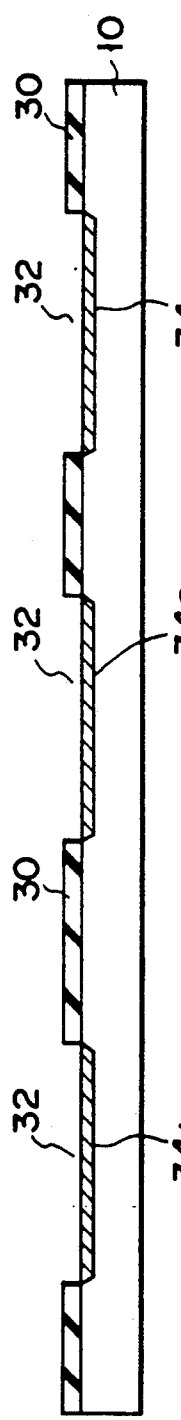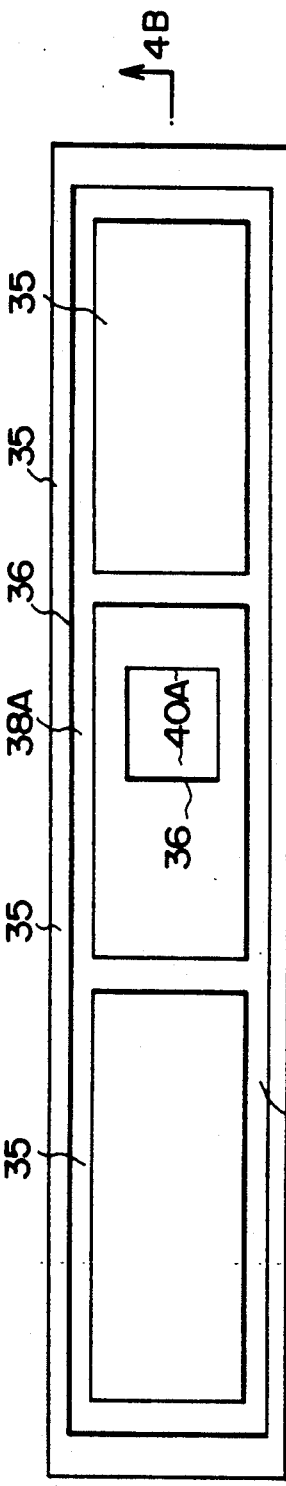

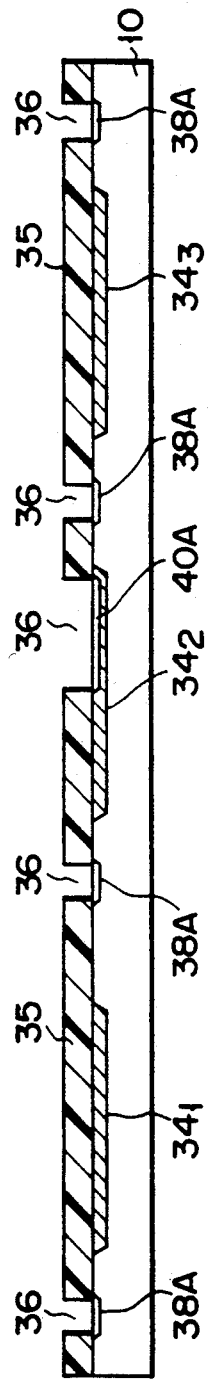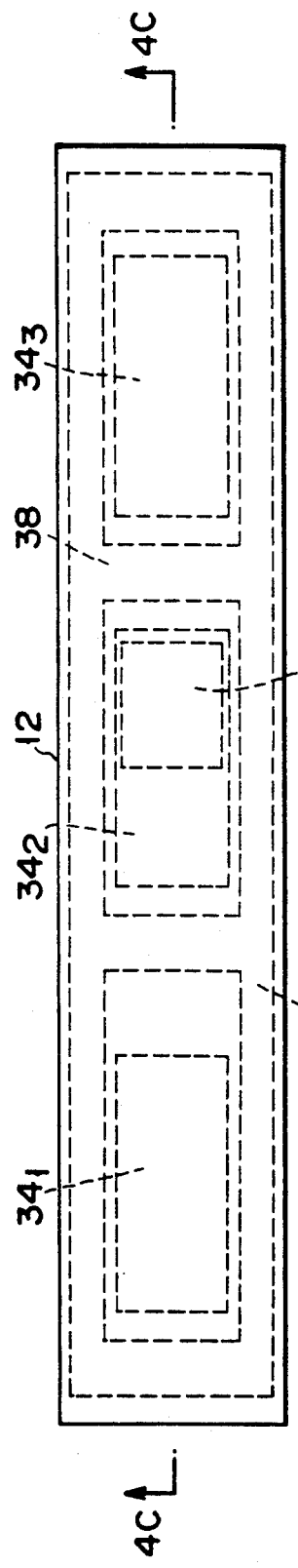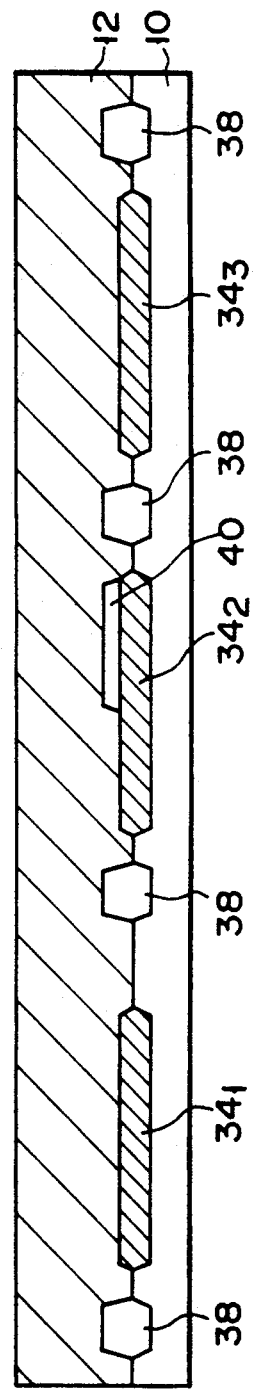

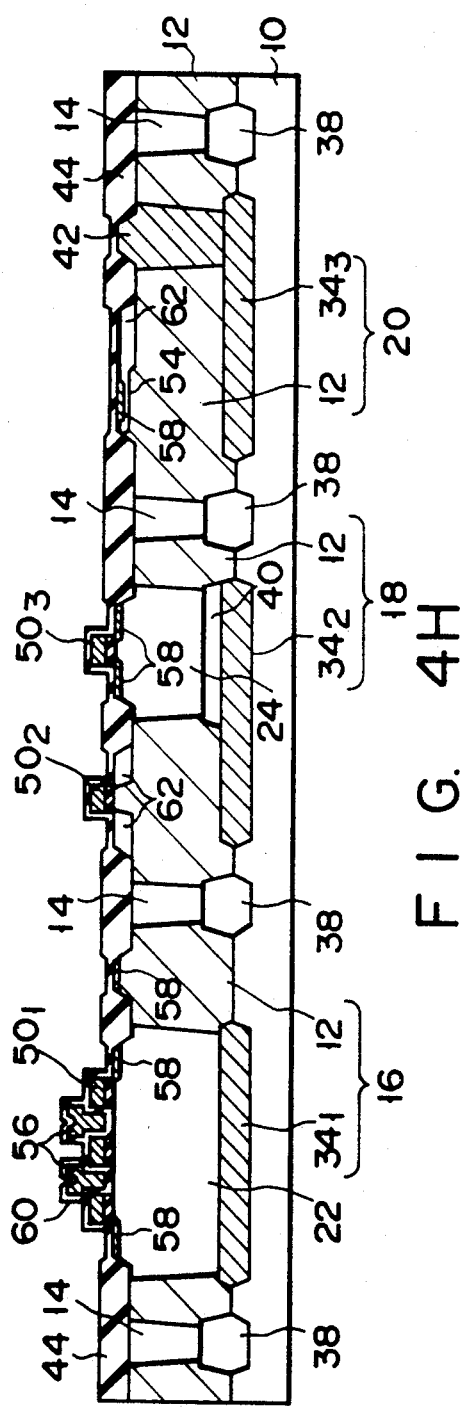

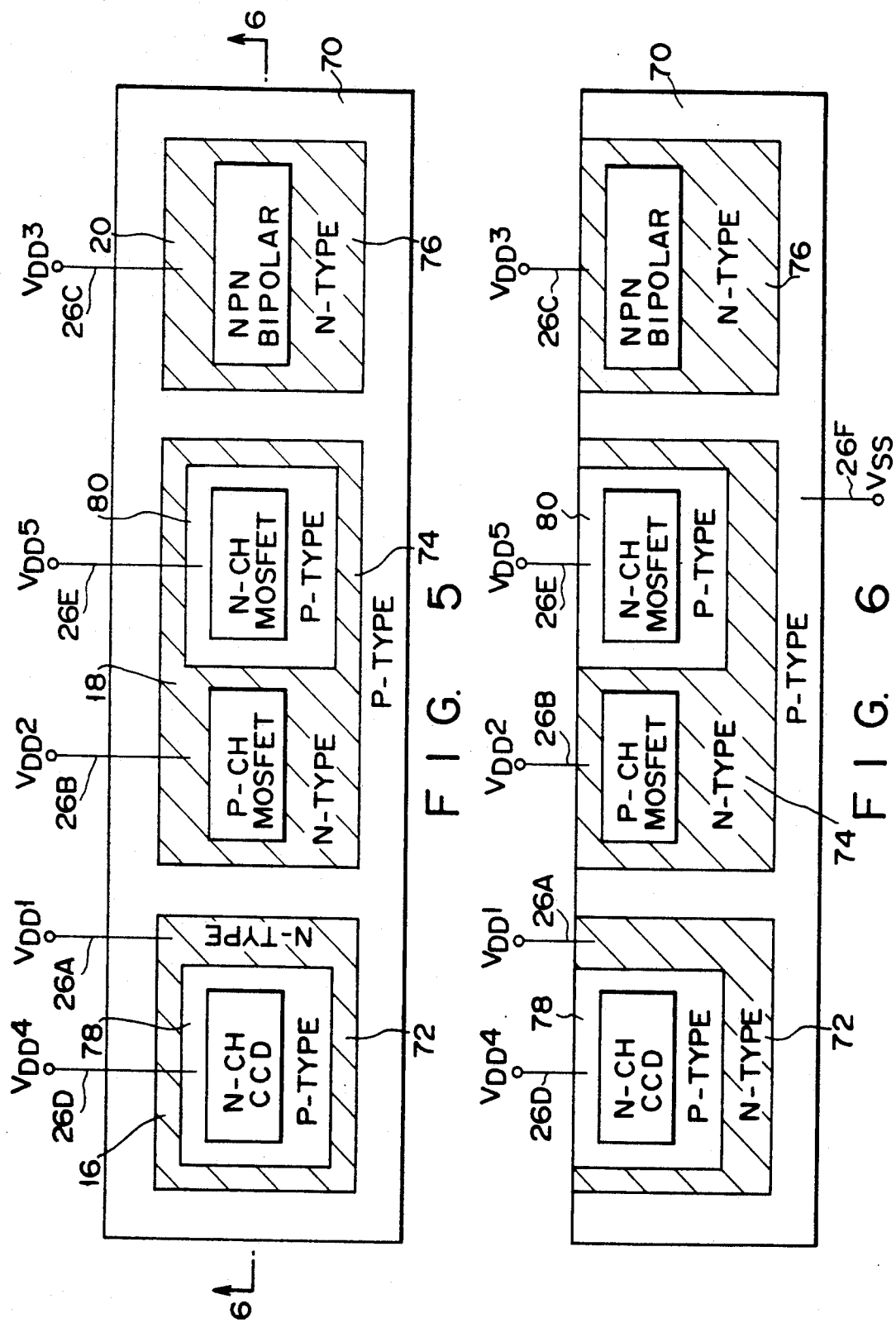

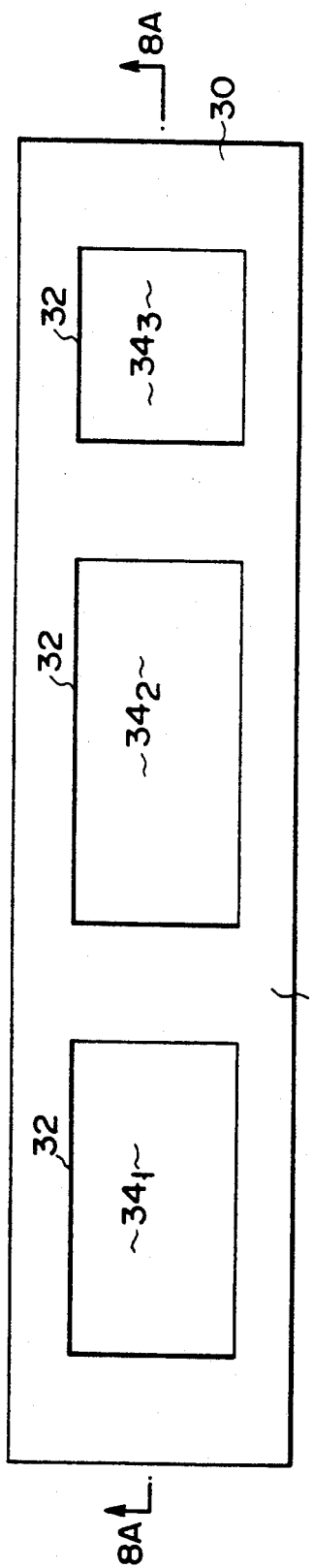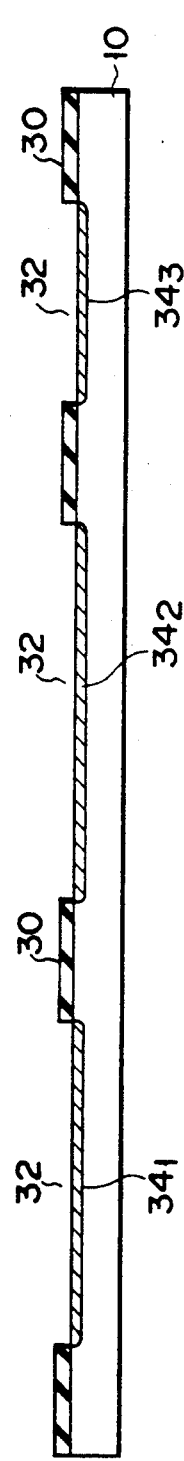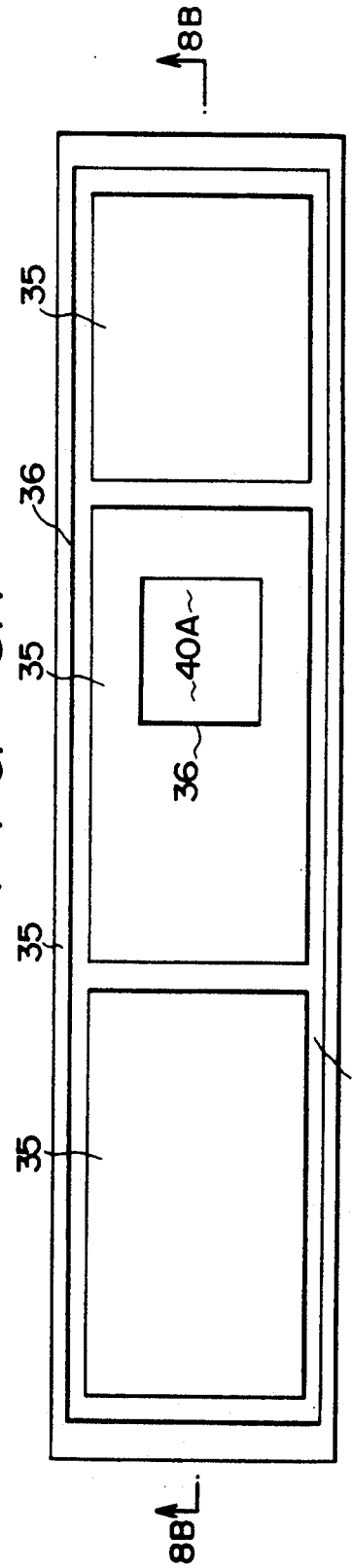
FIG. 7A
FIG. 8A
FIG. 7B

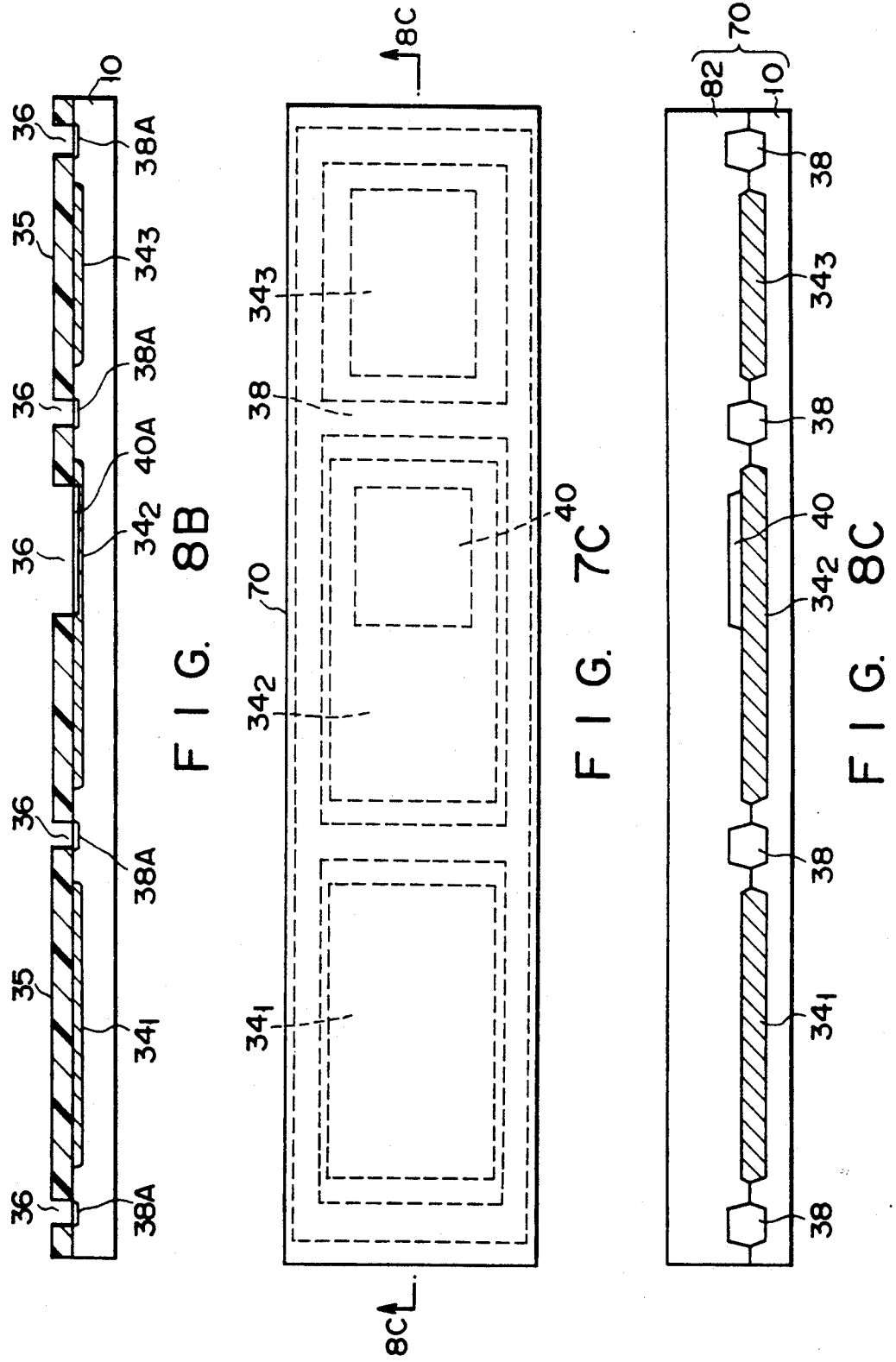

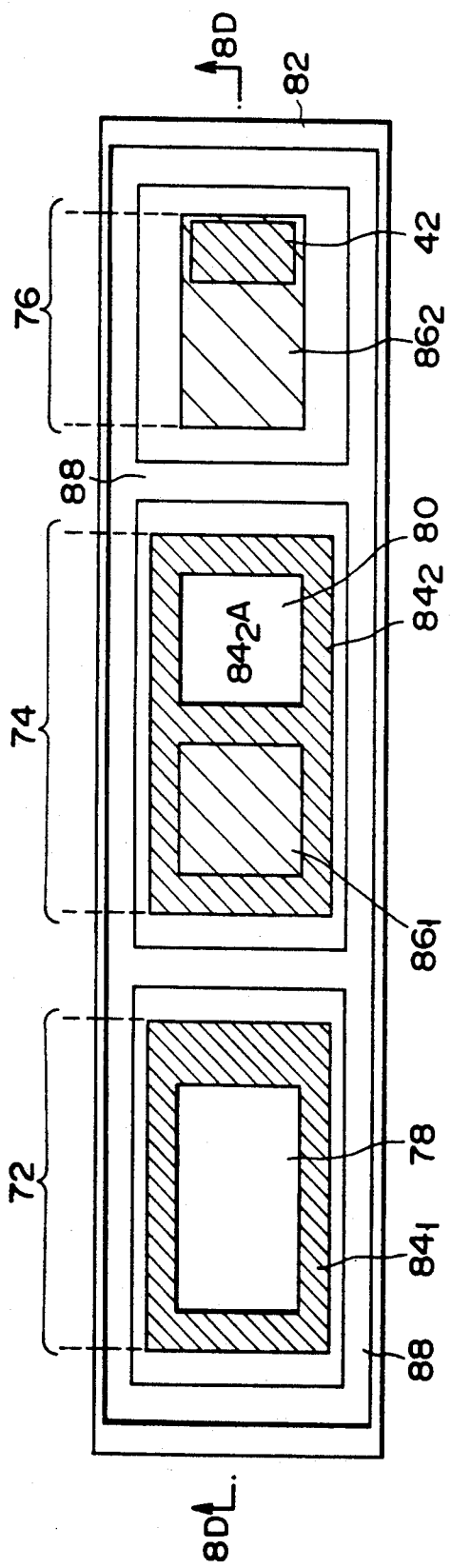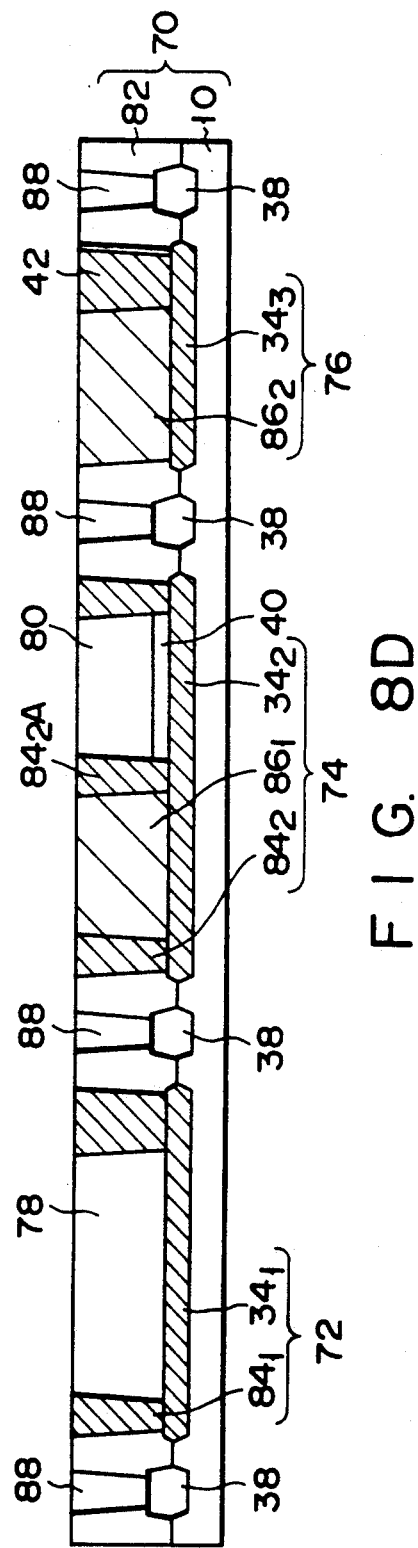

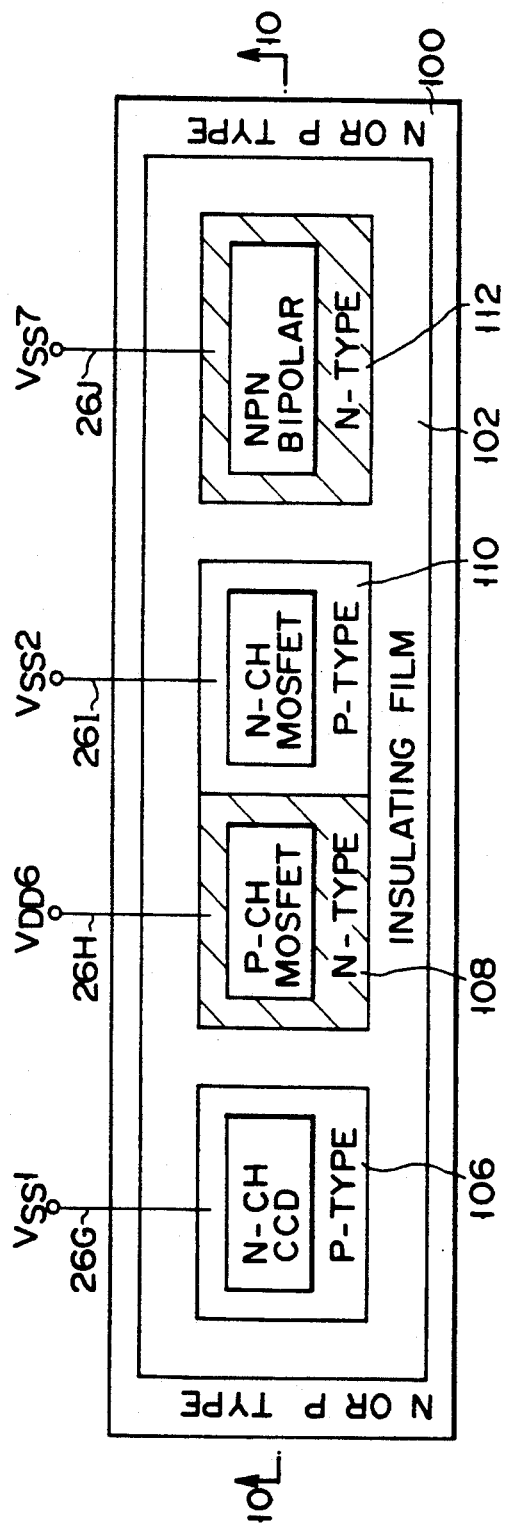
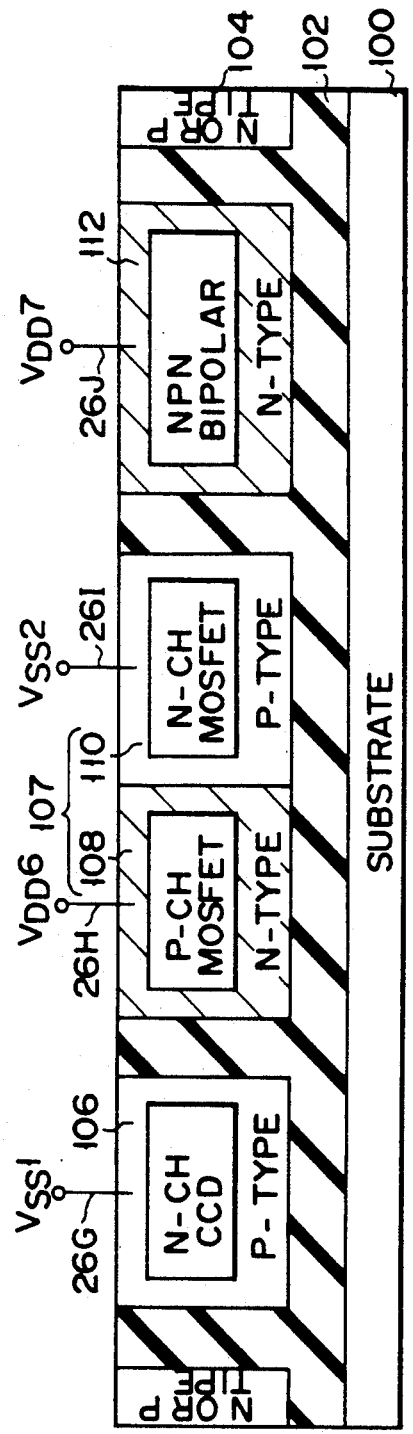
FIG. 9
FIG. 10

DEVICE HAVING A CHARGE TRANSFER DEVICE, MOSFETS, AND BIPOLAR TRANSISTORS—ALL FORMED IN A SINGLE SEMICONDUCTOR SUBSTRATE

BACKGROUND OF THE INVENTION

1. Field of the Invention

The present invention relates to a semiconductor device having a charge transfer device, MOSFETs, and bipolar transistors all formed in a single semiconductor substrate.

2. Description of the Related Art

Various charge transfer devices are known, among which is a charge-coupled device (hereinafter referred to as "CCD"). The CCD is formed in a semiconductor substrate, along with N-type channel MOSFETs which constitute various peripheral circuits for the CCD, such as a circuit for switching CCD delay lines, a CCD-driving circuit, a sample-and-hold circuit, an output circuit, and a clock-driving circuit. Hitherto, a 12 V or 9 V power supply has been used to drive the N-type channel MOSFETs. Recently, a 5 V power supply has been used instead, to save power, to cope with the increasing use of CMOS including MOSFETs, and to match the power-supply voltage of the MOSFETs with that of bipolar transistor formed on a separate chip.

When driven by a voltage of 5 V, the sample-and-hold circuit and the output circuit, either formed of N-type channel MOSFETs and being an operational amplifier, fail to produce outputs having a sufficient linearity. The poorer the output linearity of these operational amplifiers, the lower the yield of the semiconductor device having the CCD and these peripheral circuits, as is usually proved by die sort test.

The CCD delay lines are designed to delay signals by a predetermined period of time. Most circuits for processing the signals thus delayed are bipolar transistor ICs which are formed on separate chips.

Let us assume that the CCD and bipolar transistors are formed in the same semiconductor substrate, thus replacing the operational amplifiers having MOSFETs, such as the sample-and-hold circuit and the output circuit, with operational amplifiers comprising the bipolar transistors which operate at higher speed than the MOSFETs. In this case, the operational amplifiers have better output linearity, and the semiconductor device having the CCD and these operational amplifier can be manufactured with higher yield and can operate with higher efficiency. In addition, the use of the bipolar transistor IC, which processes the signals output by the CCD, results in space merit, reduction of manufacturing cost, increased device function, and a simplified system.

To make the CCD transfer an electrical charge, a transfer clock signal is supplied to the CCD. Some part of this clock signal leaks and makes noise, while being supplied through the semiconductor substrate. The noise adversely influences the bipolar transistors. In view of this, it is far from advisable to form bipolar transistors together with a CCD in the same semiconductor substrate. If influenced by the noise, bipolar transistors will fail to exhibit good characteristics, and the semiconductor device comprising the CCD and the bipolar transistors will have insufficient reliability.

SUMMARY OF THE INVENTION

Accordingly it is the object of this invention to provide semiconductor device which comprises a charge transfer device, bipolar transistors, and also MOSFETs, all formed in a single semiconductor substrate, and which operates with sufficient reliability.

To achieve the object, according to the invention, there is provided a semiconductor device comprising:

a semiconductor body of a first conductivity type, having a major surface;

first, second, and third islands of a second conductivity type, each formed in the major surface of the semiconductor body;

a first well of the first conductivity type, formed in the first island;

a second well of the first conductivity type, formed in the second island;

a charge transfer device having a back gate formed of the first well;

an insulated-gate FET of the first conductivity type, having a back gate formed of the second island;

an insulated-gate FET of the second conductivity type, having a back gate formed of the second well; and a bipolar transistor having a collector formed of the third island.

In the semiconductor device, the first island surrounds the first well which functions as the back gate of the charge transfer device. Hence, the first island blocks the noise generated in the first well, and the noise influences no other island. The device is therefore reliable despite the fact that the charge transfer device and the bipolar transistor are formed on the same chip.

Further, the semiconductor body electrically isolates the first, second, and third islands from one another. Naturally, the first well and the second well, which are formed in the first island and the second island, respectively, are also electrically isolated from each other. Hence, any FET, whose back gate is one of the islands or one of the wells, can have a back-gate bias which is different from the collector bias of the bipolar transistor whose collector is the third island. This increases the freedom of designing the semiconductor device, and elements having various characteristics can be formed in the same substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view showing the general structure of a semiconductor device according to a first embodiment of the present invention, in particular, an element-forming region of the device;

FIG. 2 is a sectional view, taken along line 2—2 in FIG. 1;

FIGS. 3A to 3E are plane views representing the electrode patterns and explaining the steps of manufacturing the device shown in FIG. 1;

FIGS. 4A to 4J are sectional views, explaining the steps of manufacturing the device shown in FIG. 1, FIGS. 4A to 4E being taken along lines 4A—4A to 4E—4D which are shown in FIGS. 3A to 3E, respectively;

FIG. 5 is a plan view showing the general structure of a semiconductor device according to a second embodiment of the present invention, in particular, an element-forming region of the device;

FIG. 6 is a sectional view, taken along line 6—6 in FIG. 5;

FIGS. 7A to 7E are plane views, explaining the steps of manufacturing the semiconductor device shown in FIG. 6;

FIGS. 8A to 8F are sectional views, explaining the steps of manufacturing the device shown in FIG. 5, FIGS. 8A, 8B, 8C, 8D and 8E being taken along lines 8A—8B to 8E—8E shown in FIGS. 7A to 7E, respectively;

FIG. 9 is a plane view representing the general structure of a semiconductor device according to a third embodiment of the present invention, in particular an element-forming region of the device;

FIG. 10 is a sectional view, taken along line 10—10 in FIG. 9;

DETAILED DESCRIPTION OF THE PREFERRED EMBODIMENTS

Figure 3D:
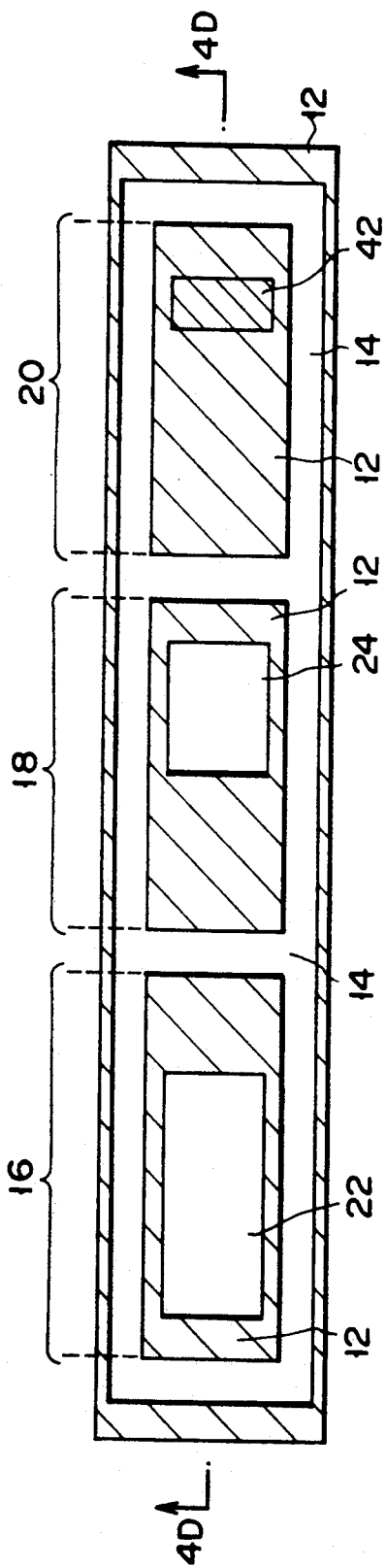

Several embodiments of the present invention will now be described, with reference to the accompanying drawings.

FIG. 1 is a plane view showing the general structure of a semiconductor device according to a first embodiment of the present invention. In particular, FIG. 1 shows the element-forming region of the semiconductor device. FIG. 2 is a sectional view, taken along line 2—2 in FIG. 1.

As FIGS. 1 and 2 show, an N-type silicon epitaxial layer 12 is formed on a P-type silicon substrate 10. A P-type isolation diffusion layer 14 is formed in the layer 12 by diffusing a P-type impurity into the layer 12. As is evident from FIG. 2, the layer 14 extends from the upper surface of the silicon epitaxial layer 12 to the upper surface of the silicon substrate 10, dividing the layer 12 into three N-type islands 16, 18, and 20. P-type wells 22 and 24 are formed in the islands 16 and 18, respectively. An N-channel CCD is formed on the well 22, which serves as the back gate of the N-channel CCD. A P-channel MOSFET is formed on the island 18, which serves as the back gate of the P-channel MOSFET. An N-channel MOSFET is formed on the well 24, which serves as the back gate of the N-channel MOSFET. An NPN bipolar transistor is formed on the island 20, which serves as collector of the NPN bipolar transistor.

As is shown in FIG. 1, the N-type island 16 surrounds the well 22 on which the N-channel CCD is formed. Hence, the N-type island 16 blocks the noise generated from the transfer clock signal supplied to the CCD, and the bipolar transistor is free from the influence of that noise. The bipolar transistor operates reliably despite that the bipolar transistor, the CCD, and the MOSFETs are formed in the same substrate 10.

The islands 16, 18, and 20 electrically float, and so do the wells 22 and 24. Various potentials are applied to these five regions. More precisely, potentials VDD1, VDD2, and VDD3 are applied to the islands 16, 18, and 10 through terminals 26A, 26B, and 26C, respectively, while potentials VDD4 and VDD5 are applied to the wells 22 and 24 through terminals 26D and 26E, respectively. Potential VSS is applied to the substrate 10 via a terminal 26F. The potentials VDD2, VDD4, and VDD5 can be varied, thereby to change the back-gate biases of the P-channel MOSFET, the CCD, and the N-channel MOSFET. Similarly, the potential VDD3 can be varied, thereby to change the collector bias of the NPN bipolar transistor to a value different from the back-gate biases of the P-channel MOSFET, the CCD, and the N-channel MOSFET. Therefore, the characteristics of these active elements can be changed in accordance with the design characteristics of the semiconductor device comprising the CCD, the MOSFETs, and the bipolar transistor, all formed in the same substrate 10.

The potential VDD1 is one which can absorb the noise the CCD generates. The potential VDD2 is optimal as the back-gate bias of the P-channel MOSFET. The potential VDD3 is optimal as the collector bias of the NPN bipolar transistor. The potential VDD4 is optimal as the back-gate bias of the N-channel CCD. The potential VDD5 is optimal as the back-gate bias of the N-channel MOSFET.

With reference to FIGS. 3A to 3E and FIGS. 4A to 4J, it will be explained how the semiconductor device shown in FIGS. 1 and 2 is manufactured, thus describing the device in greater detail.

FIGS. 3A to 3E are plan views representing the electrode patterns and explaining the steps of manufacturing the device shown in FIG. 1. FIGS. 4A to 4J are sectional views, explaining the steps of manufacturing the device shown in FIG. 1. FIGS. 4A to 4E are sectional views taken along lines 4A—4A to 4E—4E which are shown in FIGS. 3A to 3E, respectively. In these figures, the component identical to those shown in FIGS. 1 and 2 are denoted at the same reference numeral.

As is illustrated in FIGS. 3A and 4A, the surface region of the P-type silicon substrate 10, which has a resistivity of 25 Ω.cm, is heated at about 1000° C. and thermally oxidized, thus forming a silicon oxide film 30 having a thickness of about 1 μm. The silicon oxide film 30 is patterned by means of photoetching, thus forming windows 32 in the film 30. Antimony is diffused through these windows 32 into the P-type substrate 10, thereby forming N+-buried layers $34_1$ to $34_3$ in the substrate 10, the layers $34_1$ to $34_3$ having a sheet resistance of 20 Ω/□. Then, the silicon oxide film 30 is removed from the substrate 10.

Next, as is shown in FIGS. 3B and 4B, a photoresist 35 is coated on the upper surface of the resultant structure. A selected portion of the photoresist 35 is removed by means of photoetching, thus forming windows 36. Boron ions are injected through these windows 36 into the substrate 10, thus forming P+-buried layers 38A in the surface of the substrate 10 and also a P+-buried layer 40A in the surface of the N+-buried layer $34_2$. Then, the photoresist 35 is removed from the substrate 10.

Then, as is shown in FIGS. 3C and 4C, an N-type silicon epitaxial layer 12 containing phosphorus and having resistivity of about 5 $\Omega$·cm is grown to the thickness of about 5 $\mu$m, on the upper surface of the resultant structure. While the epitaxial layer 12 is growing, the impurities diffuse into the layer 12 from the layers $34_1$, $34_2$, $34_3$, 38A, and 40A, forming N+-buried layers $34_1$, $34_2$, and $34_3$ and a P+-buried layer 38 between the substrate 10 and the epitaxial layer 12. Theses layers $34_1$, $34_2$, and $34_3$ and 38 have impurity concentrations higher than that of the epitaxial layer 12. Further, a P+-buried layer 40 is formed between the epitaxial layer 12 and the N+-buried layer $34_2$.

Figure 4D:
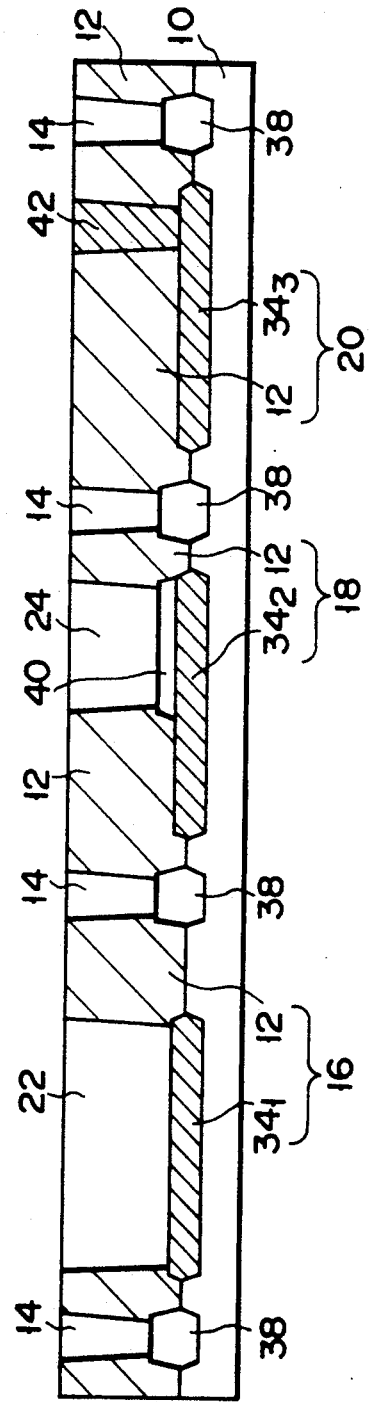

Further, the surface of the epitaxial layer 12 is subjected to thermal oxidation at 1000° C., thereby forming a silicon oxide film (not shown) having a thickness of about 500 Å and serving as a photoresist pad. Then a photoresist (now shown) is formed on the silicon oxide film, a portion of the photoresist is removed by photoetching, thus forming an opening. Phosphorus ions, for example, are injected through the opening into the epitaxial layer 12, thereby forming a collector region. The remaining photoresist is removed from the silicon oxide film. Next, a photoresist is formed on the silicon oxide film. The photoresist is photo-elected, whereby openings are made in the photoresist. Boron ions, for example, are injected through these openings into the epitaxial layer 12, thereby forming P-type wells and P-type isolation layers in the layer 12. The photoresist is the removed from silicon oxide film. Further, an undoped CVD oxide film (not shown) having a thickness of about 3000 Å is formed on the upper surface of the resultant structure by means of a CVD method. The structure is subjected to cap annealing at about 1190° C., thereby forming, as is shown in FIGS. 3D and 4D, an N+-collector region 42 reaching the N+-buried layer $34_3$, a P-type well 22 reaching the N+-buried layer $34_1$, a P-type well 24 reaching the P+-buried layer 40, and P+-type isolation diffusion layers 14 reaching the P+-buried layers 38.

The P+-type isolation layers 14 isolate three islands 16, 18, and 20. The island 16 consists of a part of the N-type epitaxial layer 12 and N+-buried layer $34_1$ which are electrically combined. The island 18 consists of a part of the N-type epitaxial layer 12 and N+-buried layer $34_2$ which are electrically combined. The island 20 consists of a part of the N-type epitaxial layer 12 and N+-buried layer $34_3$ which are electrically combined.

Figure 3E:
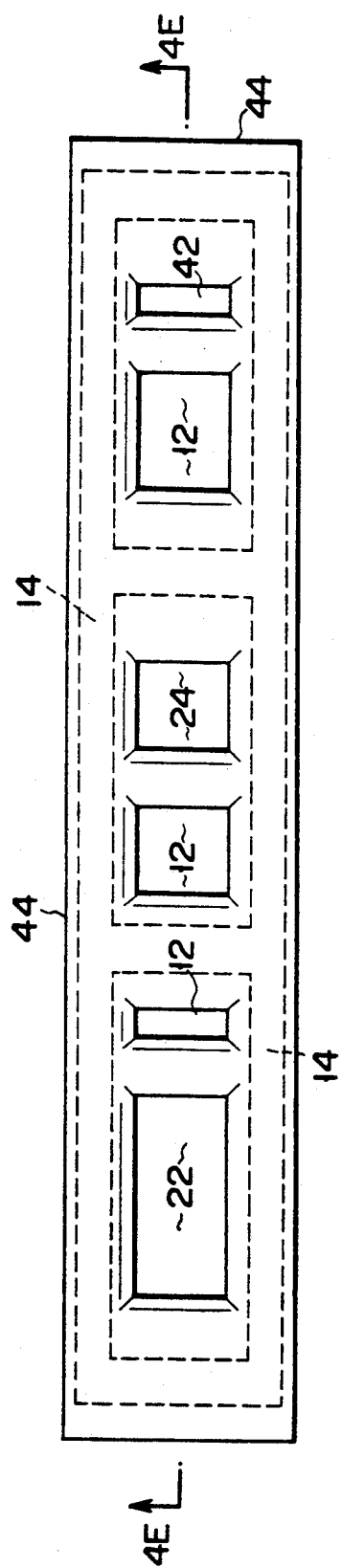
Figure 4E:
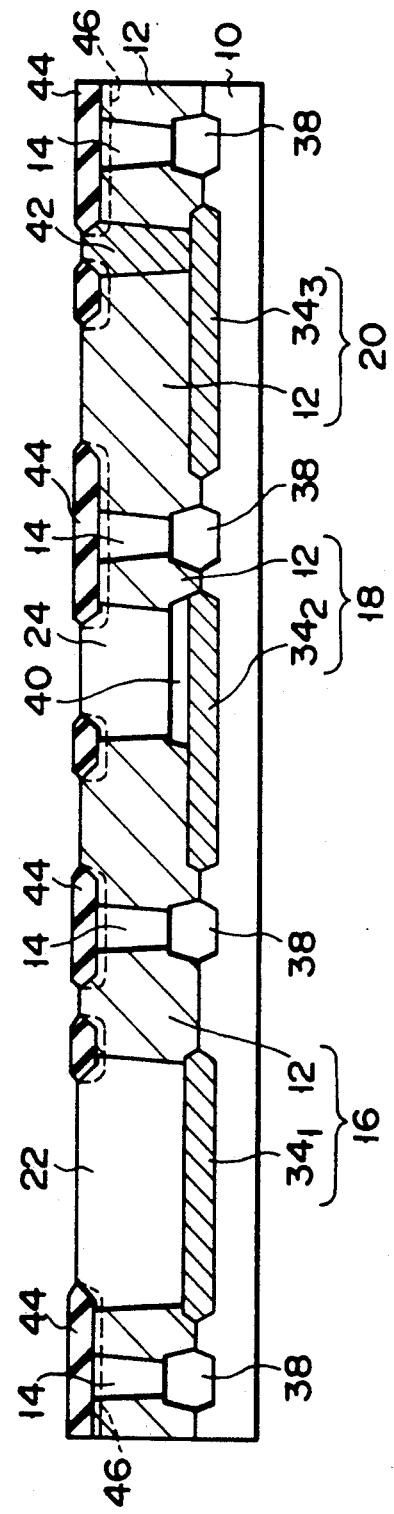

Further, as is illustrated in FIGS. 3E and 4E, a field oxide film 44 having a thickness of about 9000 Å is formed by the known LOCOS method on the upper surface of the resultant structure. Before forming the field oxide film 44, boron or phosphorus can be ion-injected into those surface portions of the structure on which the film 44 is to be formed, thereby to form channel stoppers 46 beneath the field oxide film 44.

Figure 4F:
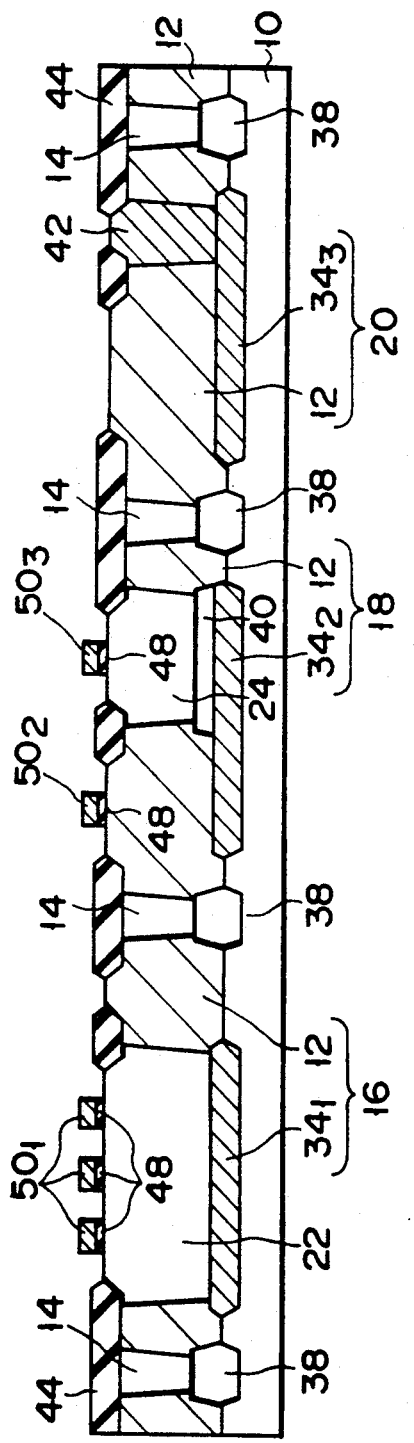

Next, as is shown in FIG. 4F, the exposed surface portions of the silicon epitaxial layer 12 are thermally oxidized at 950° C., forming a silicon oxide film 48 having a thickness of about 700 Å. This oxide film 48 will be used as the gate insulating film of the MOSFETs and as the first gate insulating film of the CCD. Boron or phosphorus is ion-injected through the film 48 into the upper surface of the structure, thus performing channel-doping. Further, a first polysilicon layer having a thickness of about 4000 Å is formed by the CVD method on the upper surface of the structure. Phosphorus is diffused into the first polysilicon layer at 950° C., using phosphoryl chloride ($POCl_3$) as the impurity source. The first polysilicon layer is thereby rendered conductive, or made into an N+-type layer. Then, a photoresist is coated on the first polysilicon layer, and the photoresist is photo-etched, thus forming a mask. Using this mask, reactive ion etching (RIE) is performed on the first polysilicon layer. As a result, the first polysilicon layer is patterned, forming the first transfer gate $50_1$ of the CCD, the gate $50_2$ of the P-channel MOSFET, and the gate $50_3$ of the N-channel MOSFET. Then, the silicon oxide film 48 is removed, by applying ammonium fluoride ($NH_4F$), using the gates $50_1$, $50_2$, and $50_3$ as mask.

Figure 4G:
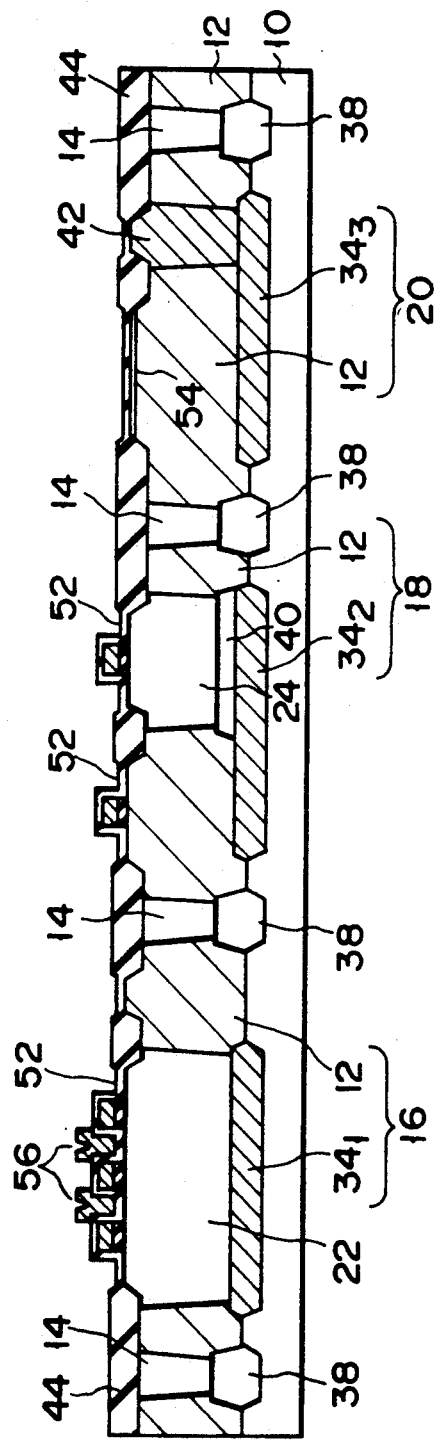

Next, as is shown in FIGS. 4G, the exposed surface portions of the silicon layer are thermally oxidized at 950° C., forming a silicon oxide film 52 having a thickness of about 700 Å. Boron ions, for example, are injected the resultant structure, by using the first transfer gate 50 and a photoresist (not shown) as a mask, thereby forming a barrier layer (not shown) of the CCD. Further, boron ions are injected into selected portions of the silicon epitaxial layer 12 by means of photoetching, in order to form the base of the NPN bipolar transistor. The structure is annealed at 900° C., forming a P−-inner-base layer 54. Then, a second polysilicon layer having a thickness of about 4000 Å is formed on the upper surface of the resultant structure by, for example, the CVD method. Phosphorus is diffused into the second polysilicon layer at 950° C., using phosphoryl chloride ($POCl_3$) as the impurity source, whereby the second polysilicon layer is made conductive, or becomes an N+-type layer. Then, a photoresist is coated on the second polysilicon layer, and the photoresist is photoetched, thus forming a mask. Using this mask, reactive ion etching (RIE) is performed on the second polysilicon layer. As a result, the second polysilicon layer is patterned, forming the second transfer gates 56 of the CCD.

Thereafter, as is shown in FIG. 4H, arsenic ions, for example, are injected into selected portions 58 of the silicon epitaxial layer 12 by means of photoetching, in order to form the N+-emitter of the NPN bipolar transistor, the N+-source/drain of the N-channel MOSFET, and the N+-source/drain of the CCD. Next, the exposed surface portions of the silicon layer are thermally oxidized at 900° C., forming a silicon oxide film 60 on the second transfer gates 56. Boron ions, for example, are injected into selected portions 62 of the silicon epitaxial layer 12 by means of photoetching, in order to form the P+-outer base of the NPN bipolar transistor, the P+-source/drain of the N-channel MOSFET, and the N+-source/drain of the CCD.

Then, as is shown in FIG. 4I, an interlayer insulator film 64, consisting of a silicon oxide film and a BPS (Boro-Phospho Silicate) glass film, is formed on the resultant structure by means of the CVD method. More specifically, the silicon oxide film is formed on the upper surface of the structure, and then the BPS glass film is formed on the silicon oxide film. The silicate glass of the insulator film 64 is melted at about 950° C., thus performing not only glass-flowing but also phosphorous gettering. Simultaneously, the arsenic and boron, both ion-injected, are activated. As a result, there are formed the N+-source/drain layer $58_1$ of the CCD, the N+-contact layer $58_2$ of the island 16, the N+-source/drain layer $58_3$ of the N-channel MOSFET, and the N+-emitter layer $58_4$ of the NPN bipolar transistor. Also, the P+-source/drain $62_1$ of the P-channel MOSFET, and the P+-outer-base layer $62_2$ of the NPN bipolar transistor are formed. Further, photoetching is applied, thereby forming contact holes 66 in the interlayer insulator film 64, exposing the N+ layers $58_1$ to $58_4$ and the P+ layers $62_1$ and $62_2$.

Figure 4J:
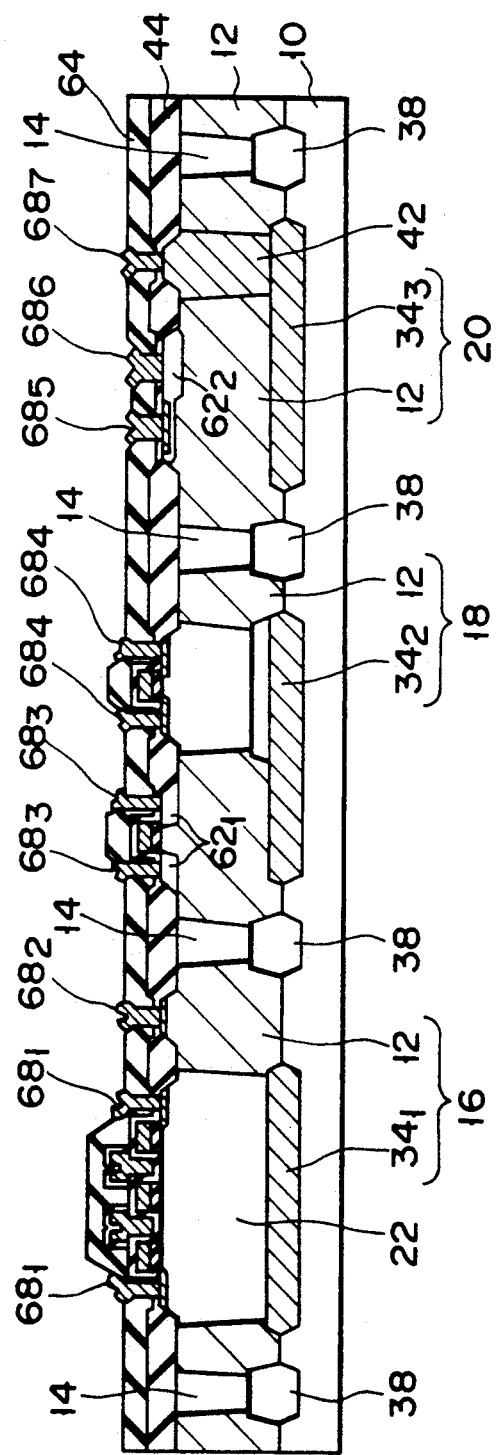

Next, as is illustrated in FIG. 4J, a metal layer made of aluminum-silicon (1%) alloy and having a thickness of about 8000 Å is formed on the upper surface of the resultant structure by means of, for example, sputtering. Then, a photoresist is coated on the metal layer, and the photoresist is photo-etched, thus forming a mask. Using this mask, reactive ion etching (RIE) is performed on the metal layer. As a result, metal wirings $68_1$, to $68_7$ are formed. The two wirings $68_1$ the source and drain wirings of the CCD, and the wiring $68_2$ are the bias wiring of the island 16. The two wirings $68_3$ are the source and drain wirings of the P-channel MOSFET. The two wiring $68_4$ are the source and drain wirings of the N-channel MOSFET. The three wirings $68_5$, $68_6$, and $68_7$ are the emitter, base and collector wirings, respectively, of the NPN bipolar transistor. This process is performed at about 450° C., thus imparting desired characteristic to each active element.

Thus manufactured is the semiconductor device according to the first embodiment of the invention, which is illustrated in FIG. 4J. Not only does this device have the advantages explained with reference to FIGS. 1 and 2, but it also will not be latched since the P+-buried layer 38, having an impurity concentration higher than that of the isolation diffusion layer 14, is interposed between the P-type silicon substrate 10 and the P-type isolation diffusion layer 14, and since the P+-buried layer 40, having an impurity concentration higher than that of the well 24, is interposed between the N+-buried layer $34_2$ and well 24.

The NPN bipolar transistor is a vertical-type bipolar transistor comprising a collector which is the N-type island 20, a P-type base 54, which is formed in the island 20, and an N-type emitter $58_4$, which is formed in the base 54. Since the collector, i.e., the N-type island 20, is part of the N-type epitaxial layer 12, the breakdown voltage of the NPN bipolar transistor can be altered merely by changing the thickness of the N-type epitaxial layer 12.

FIG. 5 is a plane view showing the general structure of a semiconductor device according to a second embodiment of the present invention. In particular, FIG. 5 shows the element-forming region of the semiconductor device. FIG. 6 is a sectional view, taken along line 6—6 of FIG. 5.

As is evident from FIGS. 5 and 6, N-type semiconductor regions 72, 74, and 76 are formed in the surface of a P-type silicon semiconductor body 70. P-type islands 78 and 80 are formed in the semiconductor regions 72 and 74, respectively. An N-channel CCD is formed on the island 78, which serves as the back gate of the N-channel CCD. An N-channel MOSFET is formed on the island 80, which serves as the back gate of the N-channel MOSFET. An P-channel MOSFET is formed on the N-type semiconductor region 74, which serves as the back gate of the P-channel MOSFET. An NPN bipolar transistor is formed on the semiconductor region 76, which serves as the collector of the NPN bipolar transistor.

As is shown in FIG. 6, the N-type semiconductor region 72 surrounds the island 78 on which the N-channel CCD is formed. Hence, the N-type semiconductor region 72 blocks the noise generated from the transfer clock signal supplied to the CCD, and the bipolar transistor is free of the influence of that noise. The bipolar transistor operates reliably despite that the bipolar transistor, the CCD, and the MOSFETs are formed in the same semiconductor body 70.

The semiconductor regions 72, 74, and 76 electrically float, and so do the islands 78 and 80. Various potentials are applied to these five regions. More precisely, potentials VDD1, VDD2, and VDD3 are respectively applied to the regions 72, 74, and 76 through terminals 26A, 26B and 26C, respectively, while potentials VDD4 and VDD5 are applied to the islands 78 and 80 through terminals 26D and 26E, respectively. Potential VSS is applied to the semiconductor body 70 through a terminal 26F. The potentials VDD1 to VDD5 and the potential VSS can be changed, as in the first embodiment shown in FIGS. 1 and 2.

With reference to FIGS. 7A to 7E and FIGS. 8A to 8F, it will be explained how the semiconductor device shown in FIGS. 5 and 6 is manufactured, thus describing the device in greater detail.

FIGS. 7A to 7E are plane views representing the electrode patterns and explaining the steps of manufacturing the device shown in FIGS. 5 and 6. FIGS. 8A to 8F are sectional views, explaining the steps of manufacturing the device shown in FIGS. 5 and 6. FIGS. 8A to 8F are sectional views taken along lines 8A—8A to 8E—8E which are shown in FIGS. 7A to 7E, respectively. The components shown in these figures, which are identical to those shown in FIGS. 1 to 6 are denoted by the same reference numerals, and will not be described in detail.

First, as is shown in FIGS. 7A and 8A, antimony is diffused through the windows 32 formed in a silicon oxide film 30, in the same way as in the first embodiment, is diffused into the P-type substrate 10, thereby forming N+-buried layers $34_1$ to $34_3$ in the substrate 10, the layers $34_1$ to $34_3$ having a sheet resistance of 20 $\Omega/\square$.

Next, as is shown in FIGS. 7B and 8B, a photoresist 35 is coated on the upper surface of the resultant structure. A selected portion of the photoresist 35 is removed by means of photoetching thus forming windows 36. Boron ions are injected through these windows 36 into the P-type semiconductor substrate 10, thus forming highly ion-implanted regions 38A in the surface of the substrate 10, and also a highly ion-implanted region 40A in the surface of the N+-buried layer $34_2$.

Then, as is shown in FIGS. 7C and 8C, a P-type silicon epitaxial layer 82 containing boron and having a resistivity of about 20 $\Omega$.cm is grown to a thickness of about 5 $\mu$m, on the upper surface of the resultant structure. While the layer 82 is growing, N+-buried layers $34_1$, $34_2$, and $34_3$, and a P+-buried layer 38 are formed between the substrate 10 and the epitaxial layer 82. At the same time, a P+-buried layer 40 is formed between the N+-buried layer $34_2$ and the epitaxial layer 82. The P+-buried layers 38 and 40 have impurity concentrations higher than that of the epitaxial layer 82.

In the step explained with reference to FIGS. 7C and 8C, the silicon substrate 10 and epitaxial layer 82, which are of the same conductivity type, are electrically combined. The combination of the substrate 10 and the layer 82 is equivalent to the semiconductor body 70 shown in FIG. 6.

Further, a silicon oxide film (not shown) is formed on the epitaxial layer 82 in the same way as in embodiment 1. Then a photoresist (not shown) is formed on the silicon oxide film, a portion of the photoresist is removed photoetching, thus forming an opening. Phosphorus ions, for example, are injected through the opening into the epitaxial layer 82, to form N+-type isolation layers and a N+-collector region. The remaining photoresist is removed from the silicon oxide film. Next, a photoresist is formed on the silicon oxide film. The photoresist is photo-etched, thereby openings are made in the photoresist. Phosphorus ions, for example, are injected through these openings into the epitaxial layer 82, thereby forming N-type wells in the epitaxial layer 82. The remaining photoresist is removed from the silicon oxide film. Next, a photoresist is formed on the silicon oxide film. The photoresist is photo-etched, thereby opening. Boron ions, for example, are injected into the layer 82 through this opening, thereby to form P+-surrounding diffusion layer. The resultant structure is subjected to cap annealing at about 1190° C., thereby forming, as is shown in FIGS. 7D and 8D, a first N+-type isolation layer $84_1$ reaching the N+-buried layer $34_1$, a second N+-type isolation layer $84_2$ reaching the N+-buried layer $34_2$, and an N-type well $86_1$. Also, an N+-type collector region 42 reaching the N+-buried layer $34_3$ and an N-type well $86_2$ are simultaneously formed. Further, a P+-type surrounding diffusion layer 88 reaching the P+-buried layer 38 is formed at the same time.

The N+-type isolation layer $84_1$ surrounds and contacts the N+-buried layer $34_1$, and the N+-type isolation layer $84_2$ surrounds and contacts the N+-buried layer $34_2$. Thus, the N+-type isolation layers $84_1$ and $84_2$ divide the epitaxial layer 82 into two islands 78 and 80, which are located on the N+-buried layer $34_1$ and $34_2$, respectively. The isolation layer $84_1$ and the buried layer $34_1$, which are of the same conductivity type, are electrically combined and are equivalent to the N-type semiconductor region 72 shown in FIG. 6. Similarly, the isolation layer $84_2$ and the buried layer $34_2$, which are of the same conductivity type, are electrically combined and are equivalent to the N-type semiconductor region 74 shown in FIG. 6. Further, the well $86_2$ and the buried layer $34_3$ are electrically combined and are equivalent to the N-type semiconductor region 76 shown in FIG. 6.

Figure 7E:
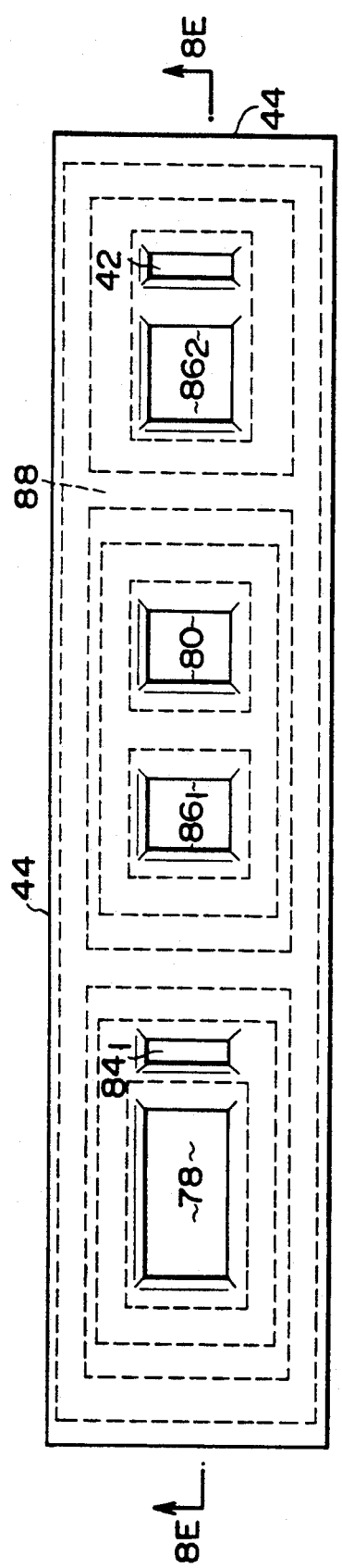
Figure 8E:
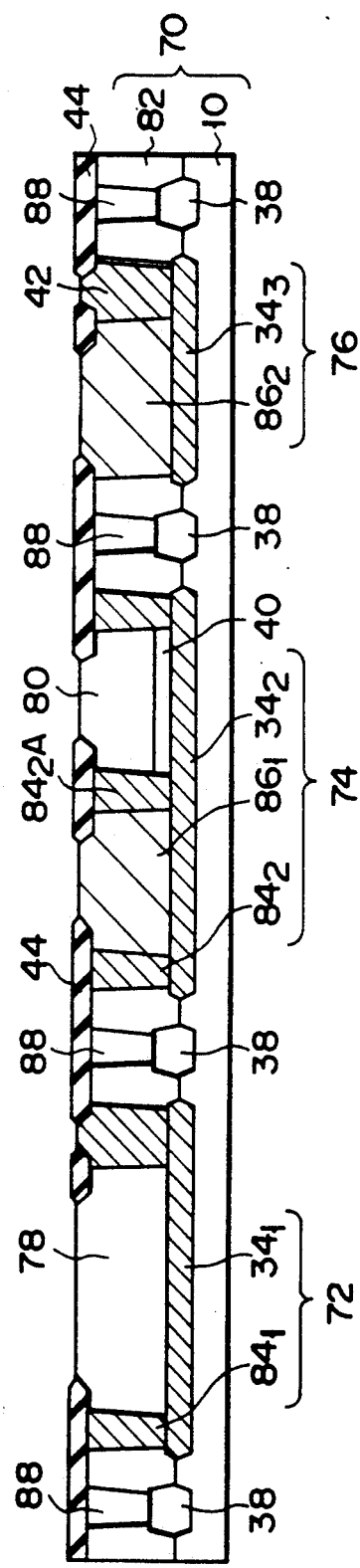

Further, as is illustrated in FIGS. 7E and 8E, a field oxide film 44 having a thickness of about 9000 Å is formed by the LOCOS method of the known type.

Figure 8F:
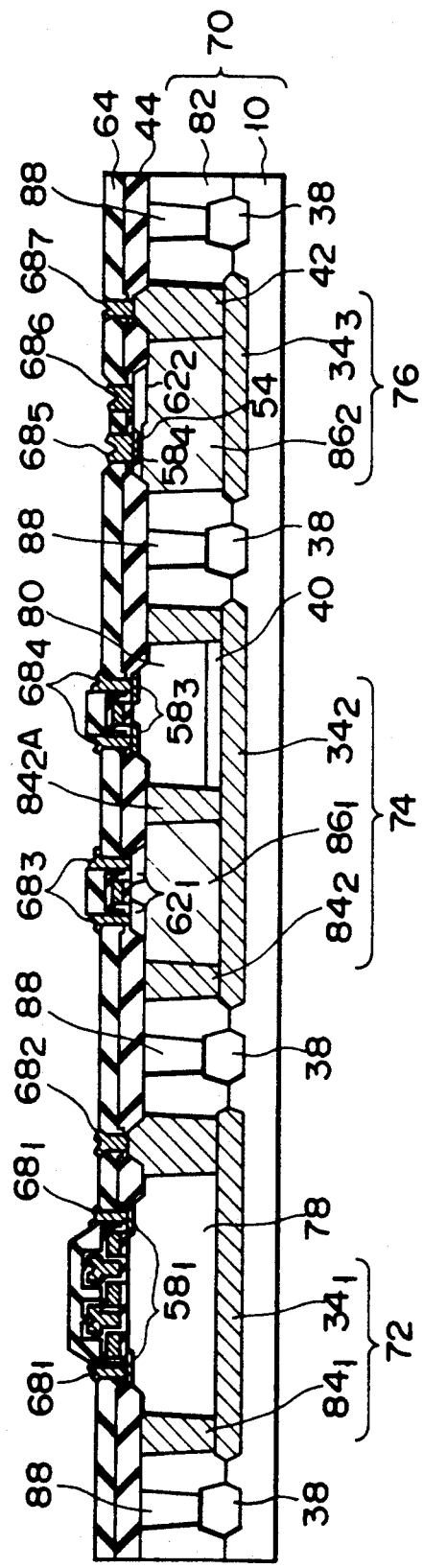

Next, as is shown in FIG. 8F, the CCD which back gate is the island 78, the N-channel MOSFET which back gate is the island 80, the P-channel MOSFET which back gate is the well $86_1$, and the NPN bipolar transistor which collector is the well $86_2$ are formed.

Thus manufactured is the semiconductor device according to the second embodiment of the invention, which is illustrated in FIG. 8F. Not only does this device have the same advantages as embodiment 1, but it is also advantageous in two respects. First, the portion $84_2$A of the isolation layer $84_2$, which has an impurity concentration higher than that of the well $86_1$, prevents the wells $86_1$ and the island 80 from being latched up, and the MOSFETs operate with high reliability. Secondly, the P+-type surrounding layer 88, which has an impurity concentration higher than that of the epitaxial layer 82, prevents the N-type semiconductor regions 72, 74, and 76 from latching up one another, and the semiconductor device therefore operates with high reliability.

FIG. 9 is a plane view showing the general structure of a semiconductor device according to a third embodiment of the present invention. In particular, it shows the element-forming region of the semiconductor device. FIG. 10 is a sectional view, taken along line 10—10 of FIG. 9.

As is shown in FIGS. 9 and 10, an insulating film 102 made of silicon oxide is formed on a silicon substrate 10. As is shown in FIG. 10, an N-type or P-type silicon layer 104 is formed on the insulation film 102. The insulating film 102 divides the silicon layer 104 into three islands 106, 107, and 112. An N-channel CCD is formed on the island 106, which serves as the back gate of the N-channel CCD. The island 107 consists of an N-type semiconductor region 110 and a P-type semiconductor region 108. A P-channel MOSFET is formed on the N-type semiconductor region 108, which serves as the back gate of the P-channel MOSFET. An N-channel MOSFET is formed on the P-type semiconductor region 110, which serves as the back gate of the N-channel MOSFET. An NPN bipolar transistor is formed on the island 112, which serves as the collector of the NPN bipolar transistor.

As is shown in FIG. 10, the insulating film 102 surrounds the semiconductor region 106 on which the CCD is formed. Hence, the film 102 blocks the noise generated from the transfer clock signal supplied to the CCD, and the NPN bipolar transistor is free from the influence of that noise. The bipolar transistor operates reliably despite that the bipolar transistor, the CCD, and the MOSFETs are formed in one silicon layer 104 which is formed on the semiconductor substrate 100.

The islands 106 and 112, which are isolated by the film 102, and the semiconductor regions 108 and 110, which are isolated by a P-N junction, are electrically floating. Potentials VSS1 and VSS2 are applied to the island 106 and the region 110 through terminals 26G and 26I, respectively. Potentials VDD6 and VDD7 are applied to the region 108 and the island 112 through terminals 26H and 26J, respectively. These potentials VSS1, VSS2, VDD6, and VDD7 can be changed, as in embodiment 1.

With reference to FIGS. 11A to 11F, FIG. 12, FIGS. 13A to 13G, and FIG. 14, it will be explained how the semiconductor device shown in FIGS. 9 and 10 is manufactured, thus describing the device in greater detail.

FIGS. 11A to 11F are sectional views representing the electrode patterns and explaining the steps of manufacturing the device shown in FIGS. 9 and 10. FIG. 12 is a plane view of the structure at the manufacturing step explained with reference to FIG. 11C. The components shown in these figures, which are identical to those shown in FIGS. 9 and 10 are denoted by the same reference numerals, and will not be described in detail.

Figure 11A:
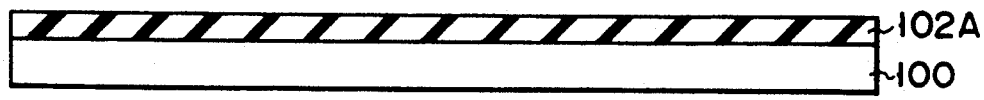
FIGS. 11A to 11F are sectional views, explaining the steps of a first method of manufacturing the device shown in FIG. 9.
Figure 12:
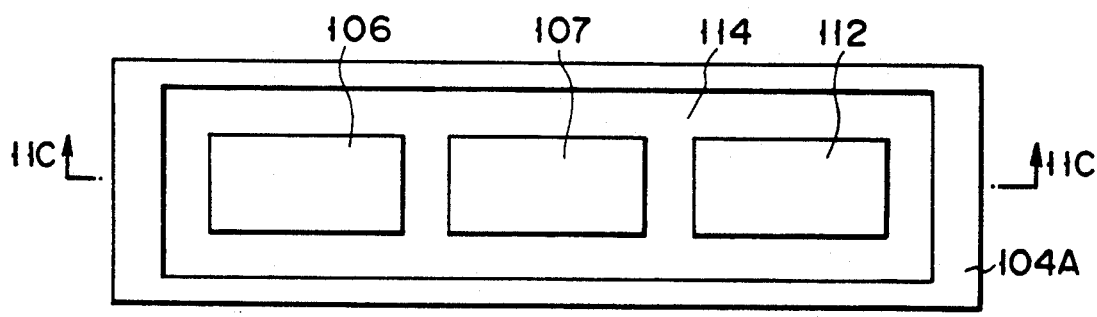
FIGS. 12 is a plane view, showing the unfinished product at the manufacturing step explained with reference to FIG. 11C.

First, as is illustrated in FIG. 11A, the surface of the first silicon substrate 100 is thermally oxidized, thus forming a silicon oxide layer 102A.

Figure 11B:
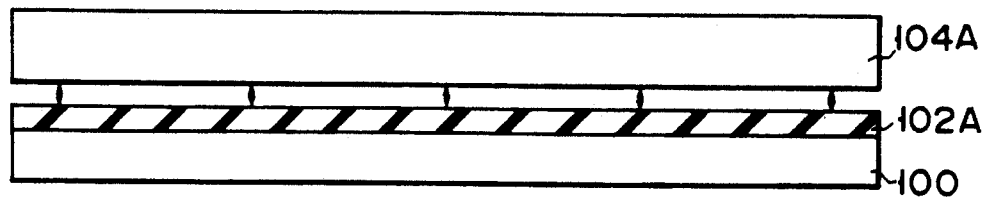

Then, as is shown in FIG. 11B, the exposed surface of the oxide layer 102A is mirror-polished. In the meantime, a second silicon substrate 104A is prepared which has a mirror-polished surface. The second substrate 104A is jointed to the first substrate 102A, with its mirror surface contacting the mirror surface of the oxide layer 102A. The resultant structure is heated, whereby the first silicon substrate 100 and the second silicon substrate 104A are bonded together.

The first substrate 100 can either be N-type or P-type. Further, substrate 100 can be replaced by a layer made of an insulating material. Moreover, the second substrate 104A can either be N-type or P-type.

Figure 11C:
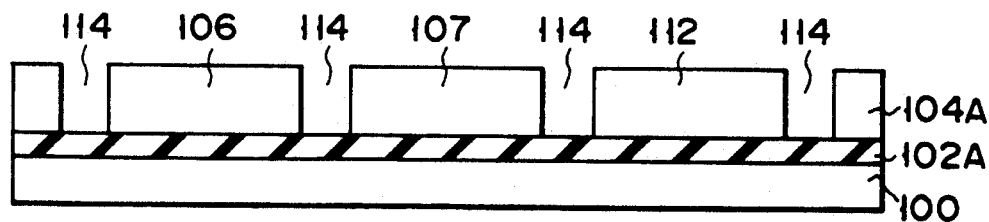

Next, as is shown in FIGS. 11C and 12, a groove 114 is formed in the second substrate 104 by means of, for example, photoetching, thus exposing selected portions of the oxide layer 102A. This groove 114 divides the second substrate 104 into three islands 106, 107, and 112.

Figure 11D:
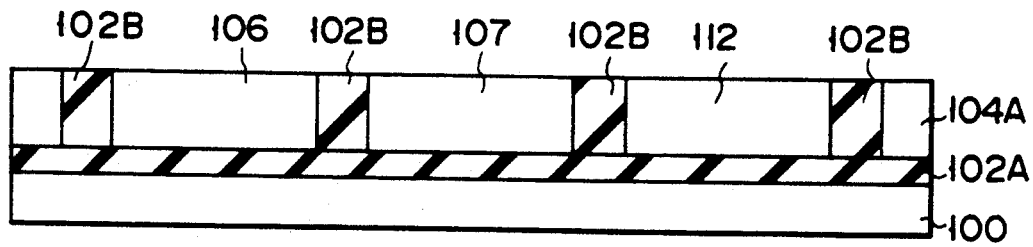
Figure 11E:
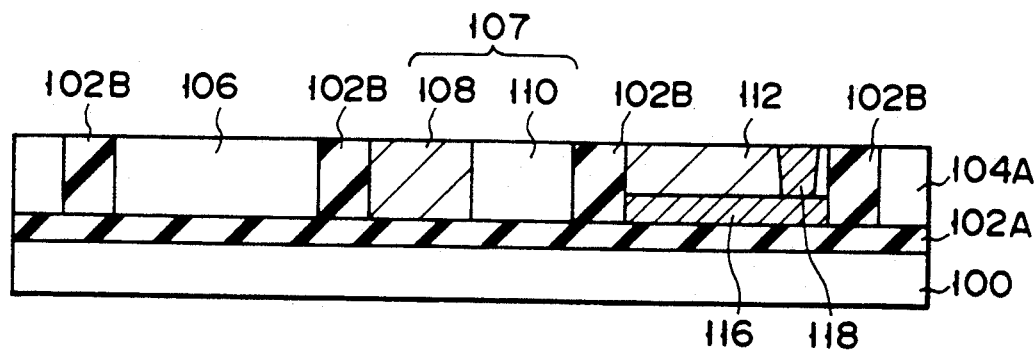

Further, as is shown in FIG. 11D, a CVD-silicon oxide film is formed on the upper surface of the resultant structure by means of a CVD method. RIE is performed, thus etching back the CVD-silicon oxide film and, subsequently, filling the groove 114 with the CVD silicon oxide 102B.

Thereafter, in the case where the substrate 104A is N-type, boron ions are injected into the islands 106 and 107, thereby rendering the island 106 a P-type island and forming a P-type semiconductor region in the island 107. Also, phosphorous ions are injected into that portion of the island 112 which is near the oxide layer 102A, to form an N+-type buried layer. Next, phosphorus ions are injected into the island 112, in order to form an N+-type collector region. The resultant structure is heat-treated, whereby the island 106 is changed into a P-type area, a P-type semiconductor region 110 is formed in the island 107, and an N+-type buried layer 116 and a collector region 118 are formed in the island 112.

Figure 11F:
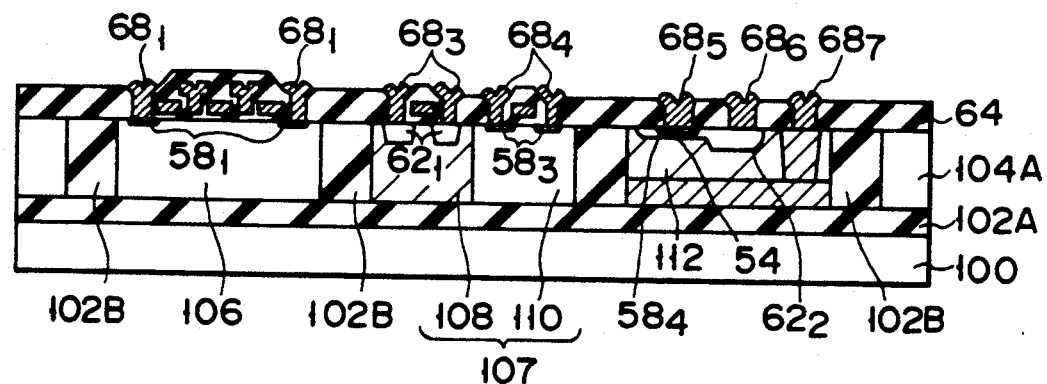

Then, as FIG. 11F shows, the CCD which back gate is the island 106, the P-channel MOSFET which back gate is the N-type semiconductor region 108, the N-channel MOSFET which back gate is the P-type semiconductor region 110, and the NPN bipolar transistor which collector is the island 112, are formed in the same way as has been explained with reference to FIGS. 4F to 4J.

The method described with reference to FIGS. 11A to 11F is a first method of manufacturing the semiconductor device according to embodiment 3.

In the semiconductor device shown in FIG. 11F, the substrate 104A can be P-type. If this is the case, phosphorus ions are injected into the islands 107 and 112, thereby changing the island 112 into an N-type area and forming an N-type semiconductor region 108 in the island 107. As a result, a semiconductor device identical in structure to the device illustrated in FIG. 11F will be manufactured.

FIGS. 13A to 13G are sectional views, explaining the steps of a second method of manufacturing a semiconductor device according to embodiment 3. More precisely, FIGS. 13A to 13G are sectional views explaining the steps of the manufacturing the device, and FIG. 14 is a plan view showing the structure obtained at the step explained with reference to FIG. 13D. The components shown in these figures, which are identical to those shown in FIGS. 9 to 10 are denoted at the same reference numerals, and will not be described in detail.

Figure 13A:
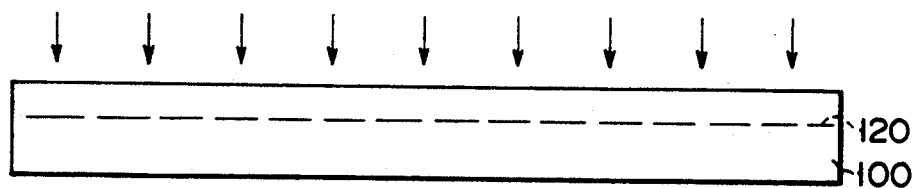
FIGS. 13A to 13G are sectional views, explaining the steps of a second method of manufacturing the device shown in FIG. 9.
Figure 14:
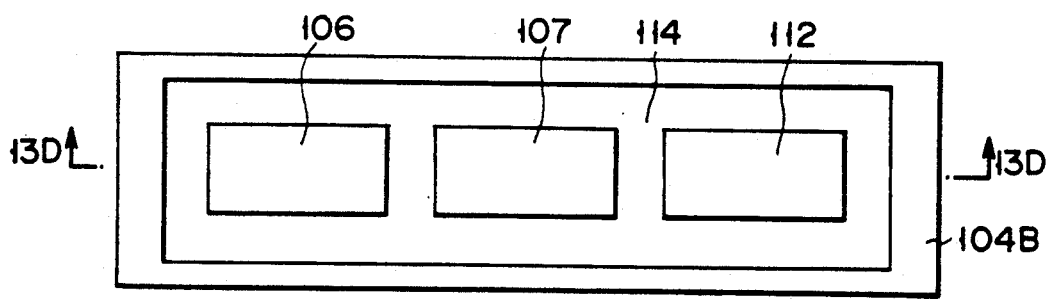
FIG. 14 is a plane view, showing the unfinished product at the manufacturing step explained with reference to FIG. 13D.

First, as is shown in FIG. 13A, oxygen ions are injected into a first P-type silicon substrate 100, thereby forming an oxygen-injected layer 120.

Figure 13B:
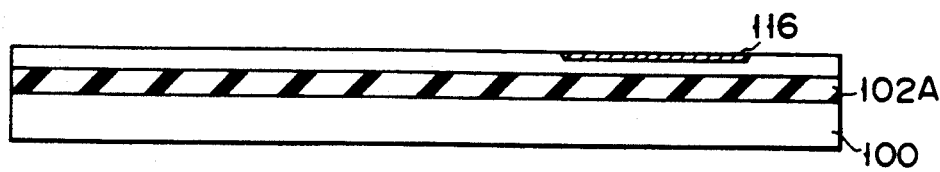

Next, the resultant structure is heat-treated, whereby the oxygen-injected layer 120 changes to a silicon oxide layer 102A, as is illustrated in FIG. 13B. Then, antimony is diffused into a selected portion of the substrate 100 in the same way as explained with reference to FIG. 4B.

Figure 13C:
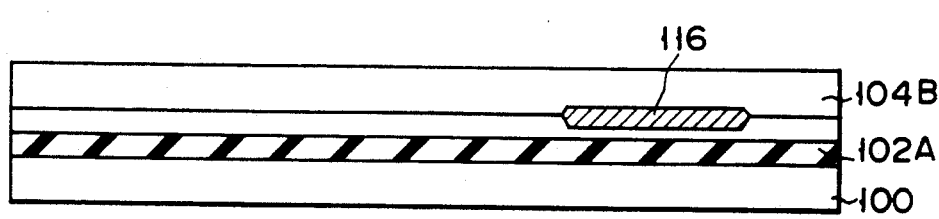

Further, as is shown in FIG. 13C, a P-type or N-type silicon epitaxial layer 104B is made to grow on the substrate 100, by the same method as explained with reference to FIGS. 4C or 8C.

Figure 13D:
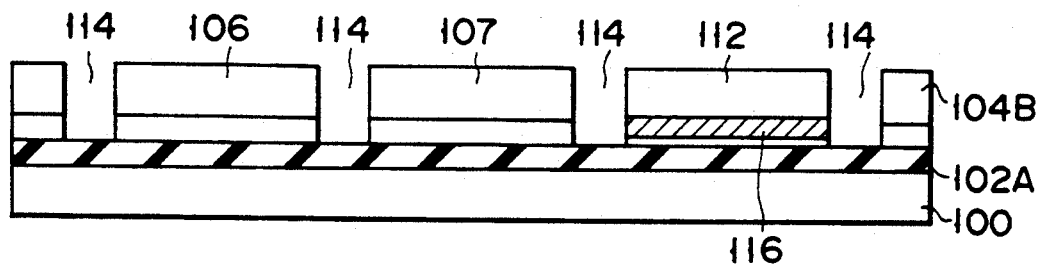

As is illustrated in FIGS. 13D and 14, a groove 114 is formed in the epitaxial layer 104B and the surface region of the substrate 100, by the same method explained with reference to FIG. 11C. This groove 114 reaches the upper surface of the oxide layer 102A, and divides the epitaxial layer 104B into three islands 106, 107, and 112.

Figure 13E:
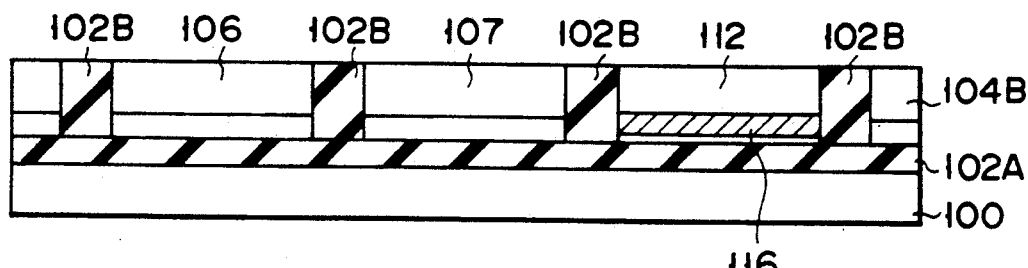
Figure 13F:
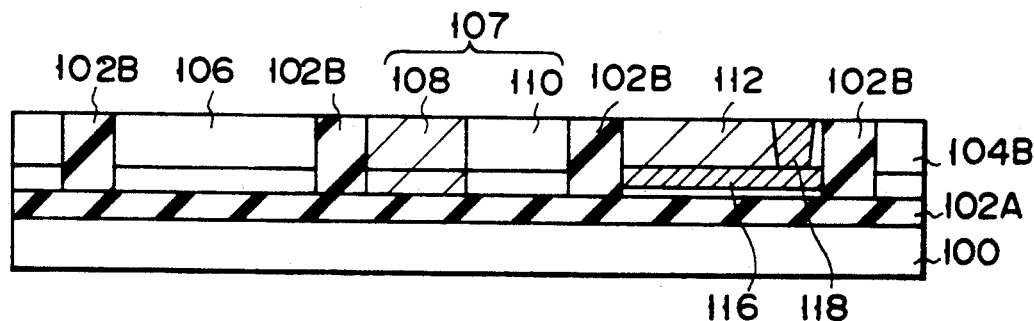

Further, as is shown in FIG. 13E, the groove 114 is filled with CVD silicon oxide 102B by the same method as explained with reference to FIG. 11D.

In the semiconductor device shown in FIG. 13E, the epitaxial layer 104B can be N-type or P-type. If the layer 104B is N type, the island 106 is changed to P-type, a P-type semiconductor region 11 is formed in the island 107, and an N+-type buried layer 116 and a collector region 118 are formed in the island 112.

Figure 13G:
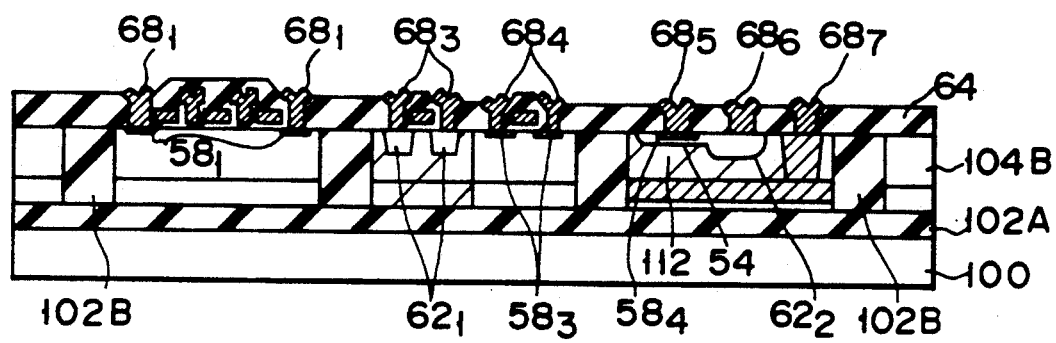

Then, as FIG. 13G shows, a CCD which back gate is the island 106, a P-channel MOSFET which back gate is the N-type semiconductor region 10B, an N-channel MOSFET which back gate is the P-type semiconductor region 110, and an NPN bipolar transistor which collector is the island 112, are formed in the same way as has been explained with reference to FIGS. 4F to 4J.

Thus manufactured is the semiconductor device according to the third embodiment of the present invention, which is illustrated in FIG. 13G. This device has the same advantages as embodiments 1 and 2. Although no N-type semiconductor regions are formed which surround the CCD located in the island 106, the other islands 107 and 112 are free from the influence of the noise generated by the CCD. This is because the CVD-silicon oxide layer 102B has a very small capacitance. There are two alternative methods of imparting little capacitance to the layer 102B. The first is to make the layer 102B narrow. The second is to bury a polysilicon layer in the CVD-silicon oxide layer 102B.

Additional advantages and modifications will readily occur to those skilled in the art. Therefore, the invention in its broader aspects is not limited to the specific details, representative devices, and illustrated examples shown and described herein. Accordingly, various modifications may be without departing from the spirit or scope of the general inventive concept as defined by the appended claims and their equivalents.

What is claimed is:

1. A semiconductor device comprising:
   a semiconductor substrate of a first conductivity type, having a major surface;
   an epitaxial layer of the first conductivity type, formed on the major surface of said semiconductor substrate;
   first, second, and third buried layers of a second conductivity type formed between said substrate and said epitaxial layer and having impurity concentrations higher than that of said epitaxial layer;
   a first insolation layer of the second conductivity type, formed in said epitaxial layer, extending from a surface thereof to said first buried layer and surrounding a portion of said epitaxial layer, thereby defining a first island;
   a second isolation layer of the second conductivity type, formed in said epitaxial layer, extending from a surface thereof to said second buried layer and surrounding a portion of said epitaxial layer, thereby defining a second island;
a first well of the second conductivity type, formed in said epitaxial layer and extending from a surface thereof to said third buried layer;
a second well of the second conductivity type, formed in said second island and contacting said second buried layer and said second isolation layer;
a charge transfer device having a back gate formed in said first island;
an insulated-gate FET of the first conductivity type, having a back gate formed in said second well;
an insulated-gate FET of the second conductivity type, having a back gate formed in said second island; and
a bipolar transistor having a collector formed in said first well.

2. The semiconductor device according to claim 1, wherein said second isolation layer has an impurity concentration higher than that of said second well.

3. The semiconductor device according to claim 1, further comprising a third isolation layer of the second conductivity type formed on a boundary of said second island and said second well, said third isolation layer having an impurity concentration higher than that of said second well.

4. The semiconductor device according to claim 1, wherein a surrounding layer of the first conductivity type, formed in the surface of said epitaxial layer, surrounds said first and second isolation layers and said first well, and has an impurity concentration higher than that of said epitaxial layer.

5. The semiconductor device according to claim 4, further comprising a fourth buried layer formed between said substrate and said surrounding layer, and having an impurity concentration higher than that of said epitaxial layer.

6. The semiconductor device according to claim 1, wherein said bipolar transistor is a vertical-type bipolar transistor having a base layer of the first conductivity type formed in said first well which is of the second conductivity type, and an emitter layer of the second conductivity type formed in the base layer.

7. The semiconductor device according to claim 1, wherein said charge transfer device is a CCD, and said insulated-gate FETs are MOSFETs.

8. The semiconductor device according to claim 1, wherein said first and second islands have first and second terminals to which potentials are to be applied, said first and second wells have third and fourth terminals to which potentials are to be applied, and said first isolation layer has a fifth terminal to which a potential is to be applied, said potentials being different from one another.

9. A semiconductor device comprising:
a semiconductor substrate having a major surface;
a first insulating film formed on the major surface of said substrate;
a semiconductor body of the first conductivity type, formed on said first insulating film;
a second insulating film, formed in said semiconductor body, extending from a surface thereof to said first insulating film, and dividing said semiconductor body into first, second, and third islands, said second island consisting of a first semiconductor region of the first conductivity type and a second semiconductor region of a second conductivity type;
a charge transfer device having a back gate formed in said first island which is of the second conductivity type;
an insulated-gate FET of the second conductivity type, having a back gate formed in said first semiconductor region;
an insulated-gate FET of the first conductivity type, having a back gate formed in said second semiconductor region; and
a bipolar transistor having a collector formed in said third island which is of the first conductivity type.

10. The semiconductor device according to claim 9, further comprising a buried layer of the first conductivity type, formed in said third island and having an impurity concentration higher than that of said third island.

11. The semiconductor device according to claim 9, wherein said charge transfer device is a CCD, and said insulted-gate FETs are MOSFETs.

12. The semiconductor device according to claim 9, wherein said bipolar transistor is a vertical-type bipolar transistor having a base layer of the second conductivity type formed in said third island, and an emitter layer of the first conductivity type formed in the base layer.

13. The semiconductor device according to claim 9, wherein said first and third islands have first and second terminals to which potentials are to be applied, and said first and second semiconductor regions have third and fourth terminals to which potentials are to be applied, said potentials being different from one another.

14. A semiconductor device comprising:
a semiconductor substrate having a major surface;
a first insulating film formed on the major surface of said substrate;
a semiconductor body of a first conductivity type, formed on said first insulating film;
a second insulating film, formed in said semiconductor body, extending from a surface thereof to said first insulating film, and dividing said semiconductor body into first, second and third islands, said second island consisting of a first semiconductor region of the first conductivity type and a second semiconductor region of a second conductivity type;
a charge transfer device having a back gate formed of said first island which is of the first conductivity type;
an insulated-gate FET of the second conductivity type, having a back gate formed of said first semiconductor region;
an insulated-gate FET of the first conductivity type, having a back gate formed of said second semiconductor region; and
a bipolar transistor having a collector formed of said third island which is of the second conductivity type.

15. The semiconductor device according to claim 14, further comprising a buried layer of the second conductivity type, formed in said third island and having an impurity concentration higher than that of said third island.

16. The semiconductor device according to claim 14, wherein said charge transfer device is a CCD, and said insulated-gate FETs are MOSFETs.

17. The semiconductor device according to claim 14, wherein said bipolar transistor is a vertical-type bipolar transistor having a base layer of the first conductivity type formed in said third island, and an emitter layer of the second conductivity type formed in the base layer.

18. The semiconductor device according to claim 14, wherein said first and third islands have first and second terminals to which potentials are to be applied, and said first and second semiconductor regions have third and fourth terminals to which potentials are to be applied, said potentials being different from one another.

19. A semiconductor device comprising:
a semiconductor body of a first conductivity type, having a major surface;
first, second, and third islands of a second conductivity type formed in the major surface of said semiconductor body;
a first well of the first conductivity type, formed in said first island;
a second well of the first conductivity type, formed in said second island;
a charge transfer device having a back gate formed in said first well;
an insulated-gate FET of the first conductivity type, having a back gate formed in said second island;
an insulated-gate FET of the second conductivity type, having a back gate formed in said second well; and
a bipolar transistor having a collector formed in said third island.

20. The semiconductor device according to claim 19, wherein said charge transfer device is a CCD, and said insulated-gate FETs and MOSFETs.

21. The semiconductor device according to claim 19, wherein said bipolar transistor is a vertical-type bipolar transistor having a base layer of the first conductivity type formed in said third island, and an emitter layer of the second conductivity type formed in the base layer.

22. A semiconductor device comprising:
a semiconductor body of a first conductivity type, having a major surface;
first, second, and third semiconductor regions of a second conductivity type, formed in the major surface of said semiconductor body;
a first well of the first conductivity type, formed in said first semiconductor region;
a second well of the first conductivity type, formed in said second semiconductor region;
a charge transfer device having a back gate formed in said first well;
an insulated-gate FET of the second conductivity type, having a back gate formed in said second well;
an insulated-gate FET of the first conductivity type, having a back gate formed in said second semiconductor region; and
a bipolar transistor having a collector formed in said third semiconductor region.

23. The semiconductor device according to claim 22, wherein said charge transfer device is a CCD, and said insulated-gate FETs of said first and second conductivity types are MOSFETs.

24. The semiconductor device according to claim 22, wherein said bipolar transistor is a vertical-type bipolar transistor having a base layer of the first conductivity type formed in said third semiconductor region, and an emitter layer of the second conductivity type formed in the base layer.

* * * * *

UNITED STATES PATENT AND TRADEMARK OFFICE
CERTIFICATE OF CORRECTION

PATENT NO. : 5,220,190
DATED : June 15, 1993
INVENTOR(S) : Minoru Taguchi et al.

It is certified that error appears in the above-indentified patent and that said Letters Patent is hereby corrected as shown below:

Claim 11, column 14, line 18, change "insulted-gate" to --insulated-gate--.

Signed and Sealed this

Twenty-sixth Day of April, 1994

*Attest:*

BRUCE LEHMAN

*Attesting Officer*     Commissioner of Patents and Trademarks